United States Patent
Kabir et al.

(10) Patent No.: US 12,327,778 B2
(45) Date of Patent: Jun. 10, 2025

(54) TRANSISTOR DIE WITH PRIMARY AND ANCILLARY TRANSISTOR ELEMENTS

(71) Applicant: NXP USA, Inc., Austin, TX (US)

(72) Inventors: Humayun Kabir, Gilbert, AZ (US); Ibrahim Khalil, Gilbert, AZ (US); Bruce McRae Green, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 603 days.

(21) Appl. No.: 17/807,841

(22) Filed: Jun. 20, 2022

(65) Prior Publication Data
US 2023/0411243 A1    Dec. 21, 2023

(51) Int. Cl.
| | |
|---|---|
| H01L 23/48 | (2006.01) |
| H01L 23/522 | (2006.01) |
| H01L 23/66 | (2006.01) |
| H10D 64/23 | (2025.01) |
| H10D 62/10 | (2025.01) |
| H10D 62/85 | (2025.01) |

(52) U.S. Cl.
CPC ............ *H01L 23/481* (2013.01); *H01L 23/66* (2013.01); *H10D 64/254* (2025.01); *H01L 23/5227* (2013.01); *H01L 2223/6605* (2013.01); *H10D 62/117* (2025.01)

(58) Field of Classification Search
CPC ......... H01L 23/66; H01L 24/00; H01L 24/49; H01L 23/481; H01L 23/5384; H01L 23/5386; H03F 3/195; H03F 3/213; H03F 3/189; H10D 64/254; H10D 64/257; H10D 64/512; H10D 84/83
See application file for complete search history.

(56) References Cited

U.S. PATENT DOCUMENTS

| | | | |
|---|---|---|---|
| 5,668,392 A | 9/1997 | Huang et al. | |
| 6,611,002 B2 * | 8/2003 | Weeks | H10D 30/801 257/190 |
| 6,683,344 B2 | 1/2004 | Tsukanov et al. | |
| 7,005,713 B2 | 2/2006 | Mayer et al. | |
| 8,304,271 B2 * | 11/2012 | Huang | H10D 62/8503 257/E27.012 |
| 9,142,586 B2 * | 9/2015 | Wang | H01L 23/481 |
| 9,224,849 B2 | 12/2015 | Colinge et al. | |

(Continued)

OTHER PUBLICATIONS

U.S. Appl. No. 17/123,939; 27 pages (Dec. 16, 2020).

*Primary Examiner* — Maliheh Malek
(74) *Attorney, Agent, or Firm* — Sherry W. Gourlay

(57) ABSTRACT

A transistor die includes input and output terminals and a source through-substrate via (TSV) between the input and output terminals. First and second primary drain contacts extend from the output terminal toward the input terminal past first and second sides, respectively, of the source TSV. An ancillary region is located adjacent to the source TSV, and boundaries of the ancillary region are defined by the source TSV, the first and second drain contacts, and one of the input terminal or the output terminal. The transistor further includes a primary transistor element, including a primary drain contact, a primary source contact, and a primary gate structure, located outside of the first ancillary region, and an ancillary transistor element, including an ancillary drain contact, an ancillary source contact, and an ancillary gate structure, located within the ancillary region.

24 Claims, 13 Drawing Sheets

(56) References Cited

U.S. PATENT DOCUMENTS

| | | | |
|---|---|---|---|
| 9,571,044 B1* | 2/2017 | Zhu | H01L 23/66 |
| 9,871,034 B1* | 1/2018 | Or-Bach | H10D 86/01 |
| 9,871,107 B2* | 1/2018 | Green | H01L 23/5227 |
| 10,432,152 B2* | 10/2019 | Watts | H01L 24/00 |
| 12,211,759 B2* | 1/2025 | Hill | H01L 23/481 |
| 2010/0295100 A1* | 11/2010 | Huang | H10D 64/251 |
| | | | 257/256 |
| 2012/0037969 A1* | 2/2012 | Sanders | H03F 3/195 |
| | | | 257/296 |
| 2012/0175777 A1* | 7/2012 | Hill | H01L 21/76898 |
| | | | 257/E23.141 |
| 2016/0343809 A1* | 11/2016 | Green | H10D 62/8503 |
| 2020/0014342 A1 | 1/2020 | Jones et al. | |
| 2021/0202408 A1* | 7/2021 | Khalil | H10D 64/257 |
| 2021/0233849 A1* | 7/2021 | Greco | H01L 23/481 |
| 2021/0233850 A1* | 7/2021 | Greco | H01L 23/5222 |
| 2021/0233893 A1* | 7/2021 | Greco | H01L 23/5389 |
| 2022/0044986 A1 | 2/2022 | Khalil et al. | |
| 2023/0068578 A1* | 3/2023 | Yu | H01L 23/5223 |
| 2023/0085890 A1* | 3/2023 | Dabral | H01L 24/18 |
| | | | 257/621 |
| 2023/0268237 A1* | 8/2023 | Hill | H01L 23/481 |
| | | | 257/48 |
| 2024/0008253 A1* | 1/2024 | Sharma | H10D 30/62 |
| 2024/0213118 A1* | 6/2024 | Then | H10D 62/8503 |
| 2024/0215256 A1* | 6/2024 | Sharma | H01L 23/5283 |
| 2024/0224536 A1* | 7/2024 | Sharma | H10B 51/30 |
| 2024/0404951 A1* | 12/2024 | Chung | H01L 23/481 |

* cited by examiner

TRANSISTOR DIE WITH PRIMARY AND ANCILLARY TRANSISTOR ELEMENTS

TECHNICAL FIELD OF THE INVENTION

The present invention relates generally to transistors. More specifically, the present invention relates to a transistor with multiple transistor elements that are integrally formed within a single semiconductor die.

BACKGROUND OF THE INVENTION

Semiconductor-based power transistor devices are commonly used in cellular base stations to provide amplification of radio frequency (RF) signals prior to transmission of those signals over the air interface. To keep up with the requirements of emerging cellular technologies (e.g., 5G), power transistor device designers continue to develop transistors that are capable of higher and higher levels of amplification (e.g., higher gain). However, these developments often include increases in the size of a power transistor semiconductor die, which results in undesirable cost increases.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

An embodiment of the present invention includes a multi-element transistor integrally formed within a semiconductor die, also referred to herein as a "transistor die." According to various embodiments, a transistor die includes the semiconductor die and one or more transistor "segments" integrally formed within the semiconductor die. When the transistor die includes multiple transistor segments, the transistor segments may be arranged in parallel within the semiconductor die.

An embodiment of a transistor segment includes an input terminal (or portion thereof), an output terminal (or portion thereof), and a through-substrate via (TSV) positioned between the input and output terminals. Each transistor segment also includes multiple transistor "elements", where each transistor element includes a channel, source and drain contacts at opposite ends of the channel, and a gate structure over the channel between the source and drain contacts.

As used herein, certain transistor elements are referred to as "primary" transistor elements, and certain other transistor elements are referred to as "ancillary" transistor elements. This terminology is used for convenience only to differentiate various transistor elements, and the terminology should not be construed as limiting. As will be explained in more detail below, the ancillary transistor elements are positioned in "ancillary regions" of the semiconductor die, which correspond to areas of the die that conventionally do not include active transistor elements. By including ancillary transistor elements in these ancillary regions, embodiments of the inventive subject matter enable significant increases in the power generating capability of the transistor die within a same physical footprint, when compared with conventional transistor layouts. Accordingly, by including ancillary transistor elements within the ancillary regions of the transistor die, the various embodiments of transistor dies disclosed herein may enable the total periphery and power of a transistor die to be increased without increasing the total die size.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

Figure 1:
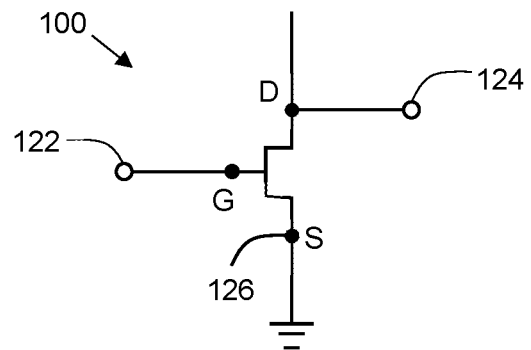
FIG. 1 shows a schematic of a common source field-effect transistor (FET) device configuration.

According to various embodiments, the inventive transistors within the transistor dies disclosed herein may be field effect transistors (FETs), which may be configured in a common source configuration. For example, FIG. 1 shows a schematic of a common source FET configuration 100. In common source FET configuration 100, the transistor gate, G, serves as an input port 122 and the transistor drain, D, serves as an output port 124. The transistor source, S, serves as a common connection 126 in common source configuration 100 since the source is coupled to a ground reference (i.e., the source is grounded) as shown in FIG. 1. Thus, common source configuration 100 is an example of a two-port active device in which two of the three terminals of the FET serve as the input and output ports, and the third terminal is utilized as the common connection. For clarity of discussion, transistor layouts discussed herein have common source configuration 100. However, the following discussion applies equivalently to other two-port active device configurations in which, for example, the transistor gate may serve as the common connection or the transistor drain may serve as the common connection.

The FET configuration 100 of FIG. 1 may be implemented with a transistor that is integrated within a single semiconductor die. More particularly, one or more transistor structures, each embodying a common source FET configuration, may be implemented in parallel between input and output terminals of the semiconductor die. FIGS. 2-9, described in detail below, depict various embodiments of FET "segments" or "portions," where multiple instances of the illustrated FET segments may be implemented in parallel to achieve a desired level of amplification. In the various top views of FET segments 200, 300, 400, 500, 600, 700, 802, 804 (FIGS. 2-8), each FET segment is shown to include two identical, side-by-side "transistor units." Two transistor units are shown for each FET segment to clearly show how adjacent transistor units within a FET segment would be arranged. Those of skill in the art would understand, based on the description herein, that a FET segment may include a single transistor unit (e.g., the left or right half of any of FET segments 200, 300, 400, 500, 600, 700, 802, 804), or a FET segment may include more than two transistor units. Further, each of the illustrated and below-described FET segments (and transistor units) include multiple transistor elements (or transistor "fingers"), where some of the transistor elements are described as "primary" elements, and others are described as "ancillary" elements. These terms are used for convenience only, and it should be understood that each primary and ancillary transistor element essentially corresponds to a transistor with a common source configuration.

The various FET segments described herein rely on electrically-conductive source TSVs to minimize common-node inductance, which may limit the high-frequency performance of the FET segment. More particularly, FET performance is enhanced by placing source TSVs within a region immediately adjacent to the gate structures. This configuration may be referred to as a "slot via" layout, in which one or more source TSVs are placed between active gate structures. The source TSVs are electrically coupled through metallization (referred to as "source metallization" herein) to source contacts, and when the transistor die is incorporated into a larger electrical system (e.g., an amplifier), the source TSVs are coupled to a ground reference node (e.g., system ground), thus establishing the common source configuration 100 of FIG. 1.

Figure 2A:
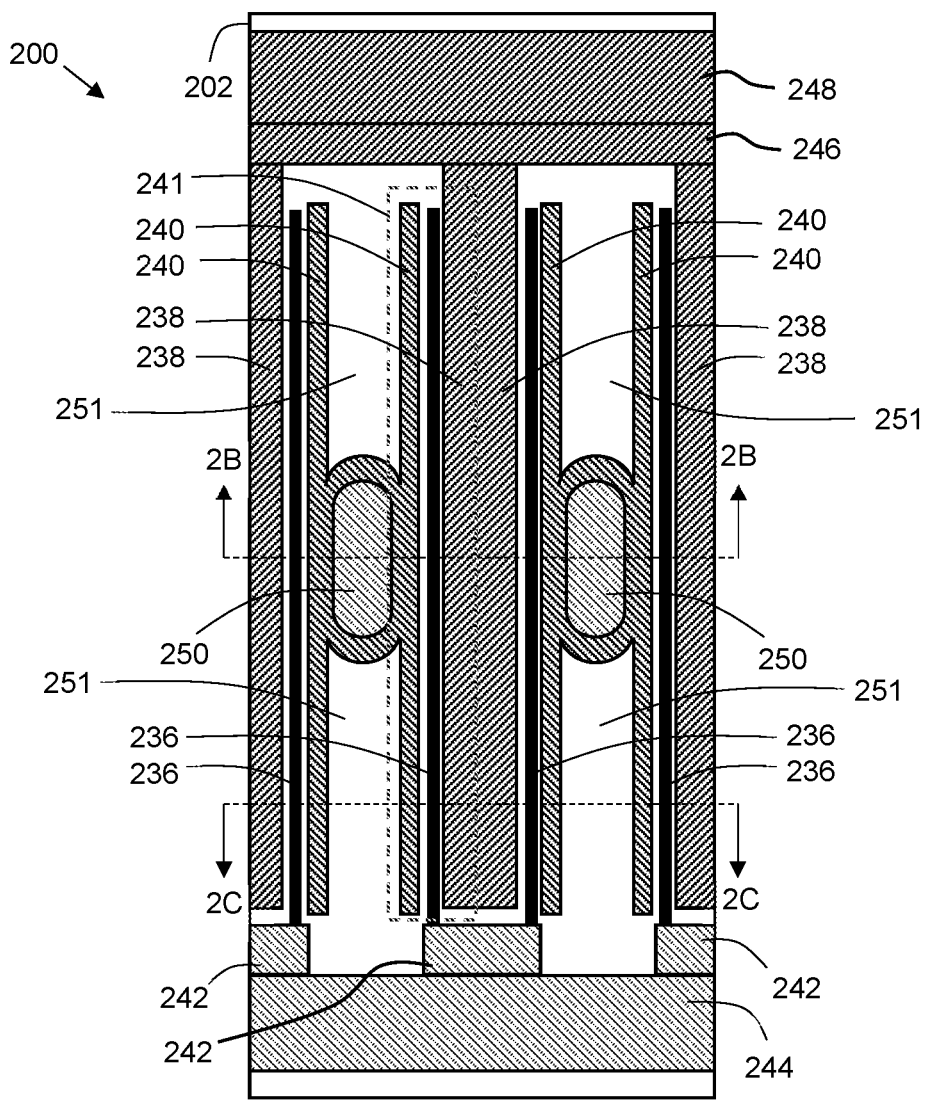
FIGS. 2A, 2B, and 2C (referred to collectively herein as FIG. 2) show top and side, cross-sectional views of a layout of a FET segment.
Figure 2B:
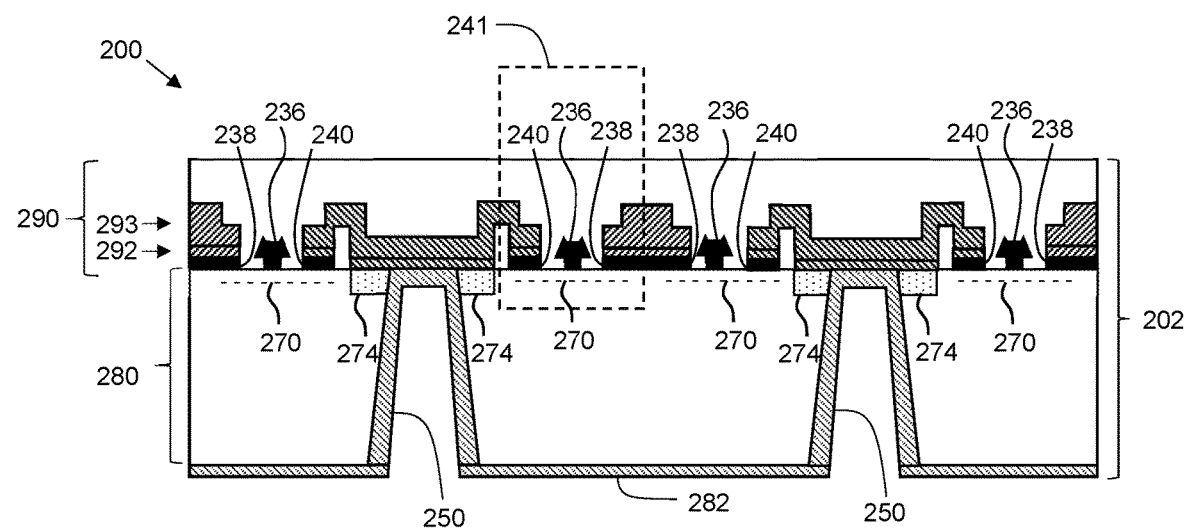
Figure 2C:
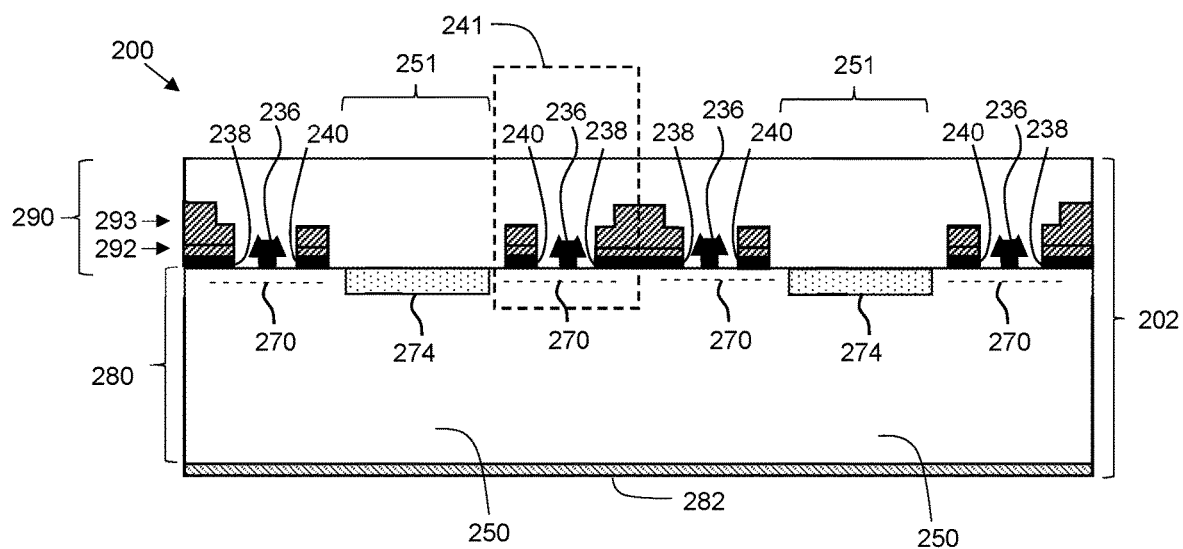

FIG. 2 (including FIGS. 2A, 2B, and 2C) show top and side, cross-sectional views of a layout of a portion or "segment" of a FET 200, where the FET segment 200 includes multiple transistor elements (e.g., element 241), each having a substantially identical configuration. More specifically, FIG. 2A shows a top view of FET segment 200, FIG. 2B is a cross-sectional side view of the FET segment 200 of FIG. 2A through line 2B-2B, and FIG. 2C is a cross-sectional side view of the FET segment 200 of FIG. 2A through line 2C-2C. Again, in a typical transistor die, multiple instances of FET segment 200 may be replicated side-by-side to build up a full-size transistor.

FET segment 200 may employ a multi-layer circuit configured integrally formed within a semiconductor substrate 202. As best shown in FIGS. 2B and 2C, the semiconductor substrate 202 includes a base semiconductor substrate 280 (or "base substrate") and a build-up structure 290 coupled to the top surface of the base substrate 280.

The build-up structure 290 includes multiple dielectric layers (not numbered) that separate multiple patterned conductive layers 292, 293, along with conductive vias (not numbered) that electrically connect portions of the conductive layers 292, 293. Portions of the conductive layers 292, 293 may be referred to as "metallization" herein (e.g., "source metallization," "drain metallization," and so on).

The conductive vias may be formed from portions of the conductive layers 292, 293 that extend through openings in an underlying dielectric layer, enabling those portions of the conductive layers 292, 293 to make contact with a portion of an underlying conductive layer or conductive feature (e.g., a gate structure 236 or a drain or source contact 238, 240). Although not shown in FIG. 2B or 2C, additional patterned conductive layers may overlie layers 292, 293, along with additional conductive vias (also not shown) that electrically interconnect the layers. Conductive layers 292, 293 and the aforementioned additional conductive layers provide electrical connections between structures at the surface of base substrate 280 (e.g., gate structures and drain/source contacts) and input and output terminals (e.g., input and output bond pads 244, 248) that are exposed at the top surface of the build-up structure 290. Although FIG. 2 shows two conductive layers 292, 293, in other embodiments, more conductive layers may be included in the build-up structure 290.

FET segment 200 includes a central region, which includes multiple sets of elongated gate structures 236 (sometimes referred to as gate fingers) (four shown), elongated drain contacts 238 (sometimes referred to as drain fingers) (four shown, noting that the two central drain contacts 238 are electrically coupled through drain metallization formed from a portion of conductive layer 293), and elongated source contacts 240 (sometimes referred to as source fingers) (four shown) formed within the build-up structure 290. As used herein, the term "contact" refers to an electrically conductive feature that directly contacts the top surface of the base substrate 280 (although a contact may be recessed below the top surface, as well) proximate to a first or second end of a channel 270 within the base substrate 280. According to an embodiment, the drain and source contacts 238, 240 may be ohmic contacts.

The drain and source contacts 238, 240 are arranged in a substantially parallel configuration, with a gate structure 236 positioned between sets of adjacent drain and source contacts 238, 240. Given this arrangement, the gate structures, drain contacts, and source contacts 236, 238, 240 may be referred to as "interdigitated." Further, each arrangement of an adjacent drain contact 238, gate structure 236, and source contact 240 may be referred to herein as a "transistor finger" or a "transistor element" (e.g., transistor finger/element 241). As best shown in FIG. 2B, a channel 270 underlies each set of adjacent drain contacts, gate structures, and source contacts 238, 236, 240 within each transistor element 241, thus providing for current to flow through the upper portion of the base substrate 280 between drain and source contacts 238, 240 in response to electrical signals applied to the gate structures 236. Each transistor element 241 may be electrically isolated from the source TSVs 250 with isolation regions 274 at and below the top surface of the base substrate 280.

As most clearly seen in FIG. 2A, the lengths (vertical dimension in FIG. 2A) of each of the gate structures 236 are substantially equal, and the gate structures 236 are arranged in parallel. Similarly, the lengths (vertical dimension in FIG. 2A) of each of the drain contacts 238 are substantially equal, and the drain contacts 238 are arranged in parallel. Finally, the lengths (vertical dimension in FIG. 2A) of each of the source contacts 240 also are substantially equal, and the source contacts 240 are arranged in parallel. Accordingly, each of the gate structures 236 have substantially the same configuration (e.g., length and orientation), each of the drain contacts 238 have substantially the same configuration, and each of the source contacts 240 have substantially the same configuration. On a higher level, each of the transistor elements are implemented in parallel, and have substantially the same configuration (e.g., length and orientation) as the other transistor elements in the FET segment 200.

Gate structures 236 are coupled together by one or more conductive gate busses 242, which in turn are connected to a first bond pad (or terminal), referred to herein as an input bond pad 244 (or input terminal). More specifically, the input bond pad 244 is coupled to gate busses 242 at an input side of FET segment 200. One or more conductive vias and/or portions of intermediate conductive layers may be used to electrically connect the gate busses 242 and the input bond pad 244. Similarly, drain contacts 238 are coupled together by a conductive drain bus 246, which in turn is connected to a second bond pad (or terminal), referred to herein as an output bond pad 248 (or output terminal). More specifically, the output bond pad 248 is coupled to drain bus 246 at an output side of FET segment 200. According to an embodiment, the drain bus 246 and the output bond pad 248 are formed from portions of an uppermost conductive layer, although in other embodiments, one or more conductive vias and/or portions of intermediate conductive layers may be used to electrically connect the drain bus 246 and the output bond pad 248. It should be noted that, in some embodiments, the input and output bond pads 244, 248 may be implemented as other types of conductive I/O structures that are not necessarily "bond pads" (e.g., structures suitable for attaching wirebonds), and thus structures 244, 248 should be thought of more generally as I/O terminals.

One or more TSVs 250 (referred to as "source TSVs") are electrically connected to each source contact 240 through "source metallization," which includes various conductive vias and portions of conductive layers in the build-up structure 290. In the FET segment 200, each source TSVs 250 is electrically coupled to two source contacts 240: one on either side of the source TSV 250. The source TSVs 250 extend through the base substrate 280 and serve to electrically connect the source contacts 240 to a ground reference node (e.g., conductive layer 282) on a lower surface of base substrate 280. In some embodiments, the conductive material within the source TSVs 250 may be portions of the conductive layer 282 that are deposited onto the sidewalls of the opening for the TSVs 250 while conductive layer 282 is being deposited.

As shown in the cross-section of FET portion 200 shown in FIG. 2C, in "ancillary" regions 251 between transistor elements (e.g., element 241) where the TSVs 250 are not present (e.g., portions of the central area between the TSVs 250 and the gate or drain busses 242, 246), no structures associated with the transistor's function (e.g., gate structures, drain contacts, source contacts) are present, with the possible exceptions of conductive routing in the patterned conductive layers 292, 293 that functions to route current between transistor structures (not shown). Instead, those ancillary regions 251 are devoid of functional transistor structures. In some embodiments, only isolation regions 274 are present in the ancillary regions 251. Alternatively, in the ancillary regions 251, the isolation regions 274 may not be present. Either way, no gate, drain, source, or other functional transistor structures 236, 238, 240, 241 are present in the ancillary regions 251 between the transistor elements.

According to various embodiments, extra or "ancillary" transistor fingers are included in the ancillary regions in order to enable a transistor to deliver higher power, when compared with a comparable transistor that does not include such ancillary transistor fingers (e.g., a transistor that includes only FET segments 200, FIG. 2). In embodiments in which the source TSV is located in a central location between the input and output terminals, suitable ancillary regions may be present on both the input side and the output side of the source TSV, and ancillary transistor fingers may be included in the input side ancillary region and/or the output side ancillary region. In an alternate embodiment in which the source TSV is located close to the input terminal (e.g., where only one suitable ancillary region is present between the source TSV and the output terminal), ancillary transistor fingers may be included in the output side ancillary region. In another alternate embodiment in which the source TSV is located close to the output terminal (e.g., where only one suitable ancillary region is present between the source TSV and the input terminal), ancillary transistor fingers may be included in the input side ancillary region. As shown in FIGS. 3-9 and explained in detail below, the ancillary transistor fingers may be positioned parallel to the primary transistor fingers, or the ancillary transistor fingers may be positioned orthogonal to the primary transistor fingers. In each of the below-described embodiments, the total periphery of the transistor device is increased without increasing total die size.

Referring now to FIG. 3 (including FIGS. 3A, 3B, 3C, and 3D), various views of a layout of a FET segment 300 are shown, in accordance with an embodiment of the present invention. More specifically, FIG. 3A shows a top view of FET segment 300, FIG. 3B is a cross-sectional view of the FET segment 300 of FIG. 3A through line 3B-3B, FIG. 3C is a cross-sectional view of the FET segment 300 of FIG. 3A through line 3C-3C, and FIG. 3D is a cross-sectional view of the FET segment 300 of FIG. 3A through line 3D-3D.

FET segment 300 may employ a multi-layer circuit configured integrally formed within a semiconductor substrate 302. As best shown in FIGS. 3B-3D, the semiconductor substrate 302 includes a base semiconductor substrate 380 (or "base substrate") and a build-up structure 390 coupled to the top surface of the base substrate 380. The base semiconductor substrate 380 may be formed, for example, from bulk or composite semiconductor materials (e.g., silicon (Si), gallium nitride (GaN), gallium arsenide (GaAs), silicon-on-insulator (Sol), GaN-on-insulator (e.g., GaN on Si, GaN on silicon carbide, GaN on sapphire, and so on), or other suitable materials).

The build-up structure 390 includes multiple dielectric layers (not numbered) that separate multiple patterned conductive layers 392, 393, 394, along with conductive vias (not numbered) that electrically connect portions of the conductive layers 392-394. Portions of the conductive layers 392-394 may be referred to as "metallization" herein (e.g., "source metallization," "drain metallization," and so on). Conductive layers 392-394 provide electrical connections between structures at the surface of base substrate 380 (e.g., gate structures and drain/source contacts) and input and output terminals (e.g., input and output bond pads 344, 348) that are exposed at the top surface of the build-up structure 390. Although FIG. 3 (and more specifically FIG. 3D) shows three conductive layers 392-394, in other embodiments, more or fewer conductive layers may be included in the build-up structure 390. In addition, although various features are illustrated within particular ones of the conductive layers 392-394, such features may be located in different layers than those depicted.

FET segment 300 includes an input bond pad 344 (or input terminal) proximate a first side of the die in which FET segment 300 is included, an output bond pad 348 (or output terminal) proximate an opposite, second side of the die in which FET segment 300 is included, and a central region 304 between the input and output bond pads 344, 348. It should be noted that, in some embodiments, the input and output bond pads 344, 348 may be implemented as other types of conductive I/O structures that are not necessarily "bond pads" (e.g., structures suitable for attaching wirebonds), and thus structures 344, 348 should be thought of more generally as I/O terminals.

The central region 304 includes multiple "primary" and "ancillary" transistor fingers, according to an embodiment. Although each of the various transistor fingers essentially include the same functional transistor structures (e.g., a gate structure, drain/source contacts, and a channel), the terms "primary" and "ancillary" are used to differentiate transistor fingers that are located outside of ancillary regions 351, 352 or within ancillary regions 351, 352, respectively.

One or more source TSVs 350 are positioned within the central region 304 between the input and output terminals 344, 348. The source TSVs 350 are electrically connected to each source contact 340 (described later) through "source metallization," which includes various conductive vias and portions of conductive layers in the build-up structure 390. In the FET segment 300, each source TSVs 350 is electrically coupled to two source contacts 340: one on either side (left side and right side in FIG. 3A) of the source TSV 350. In the description and claims, reference may be made to "sides" of the source TSV 350. Although the source TSV may have a circular or oval shape (or in other embodiments, rectangular), the TSV "sides" essentially correspond to the leftmost boundary, the rightmost boundary, the top boundary (i.e., the output-facing boundary), and the bottom boundary (i.e., the input-facing boundary) of the TSV, in the orientation depicted in FIG. 3A. As shown in FIG. 3B, the source TSVs 350 extend through the base substrate 380 and serve to electrically connect the source contacts 340 to a ground reference node (e.g., conductive layer 382) on a lower surface of base substrate 380.

Associated with each source TSV 350, a first "input side" ancillary region 351 is present on the input side (i.e., between the source TSV 350 and the input bond pad 344), and a second "output side" ancillary region 352 is present on the output side (i.e., between the source TSV 350 and the output bond pad 348). In another embodiment, and as shown in alternate FET segment 398 in FIG. 3A, the source TSV 350 may be positioned closer to the input bond pad 344, and only a single, output side ancillary region 352 may be provided between the source TSV 350 and the output bond pad 348. In another alternate embodiment, and as shown in alternate FET segment 399 in FIG. 3A, the source TSV 350 may be positioned closer to the output bond pad 348, and only a single, input side ancillary region 351 may be provided between the source TSV 350 and the input bond pad 344. In still other embodiments, multiple source TSVs 350 may be included along an axis between the input and output bond pads 344, 348, and an ancillary region may be provided between those multiple source TSVs 350. Wherever the ancillary regions are located, boundaries of an ancillary region are defined by a source TSV, first and second drain contacts, and one of the input terminal or the output terminal.

The primary transistor fingers will be defined first. Essentially, the primary transistor fingers are composed of a plurality of elongated primary gate structures 336-1 (or gate fingers) (four shown), elongated primary drain contacts 338-1 (or drain fingers) (four shown, noting that the two central drain contacts 338-1 are electrically coupled through drain metallization formed from a portion of conductive layer 393), and elongated source contacts 340 (or source fingers) (four shown) formed within the build-up structure 390. Again, as used herein, the term "contact" refers to an electrically conductive feature that directly contacts the top surface of the base substrate 380 (although a contact may be recessed below the top surface, as well) proximate to a first or second end of a channel 370 within the base substrate 380. According to an embodiment, the drain and source contacts 238, 240 may be ohmic contacts. In FIG. 3, and to assist with clarity, and source metallization is depicted with cross-hatched elements, with the cross-hatching going from upper left to lower right, whereas drain metallization is depicted with cross-hatched elements, with the cross-hatching going from lower left to upper right.

The primary drain and source contacts 338-1, 340 are arranged in a substantially parallel configuration, with a primary gate structure 336-1 positioned between and oriented in parallel with the set of adjacent primary drain and source contacts 338-1, 340, thus defining a "primary transistor finger" or a "primary transistor element" (e.g., primary transistor finger/element 341). Given this arrangement, the primary gate structures, primary drain contacts, and source contacts 336-1, 338-1, 340 may be referred to as "interdigitated." Further, each primary transistor finger/element 341 is configured so that, during operation, current from the primary source contact 340 to the primary drain contact 338-1 flows in a first direction (e.g., a horizontal direction in the orientation of FIG. 3A).

The primary gate structures 336-1 are coupled together by one or more conductive primary gate busses 342, which in turn are connected to the input bond pad 344. More specifically, the input bond pad 344 is coupled to primary gate busses 342 at an input side of FET segment 300. One or more conductive vias and/or portions of intermediate conductive layers may be used to electrically connect the primary gate busses 342 and the input bond pad 344.

Similarly, the primary drain contacts 338-1 are coupled together by a conductive drain bus 346, which in turn is connected the output bond pad 348. More specifically, the output bond pad 348 is coupled to drain bus 346 at an output side of FET segment 300. According to an embodiment, the drain bus 346 and the output bond pad 348 are formed from portions of an uppermost conductive layer 394, although in other embodiments, one or more conductive vias and/or portions of intermediate conductive layers may be used to electrically connect the drain bus 346 and the output bond pad 348.

The ancillary transistor fingers will now be defined. As indicated above and reflected in FIG. 3, the ancillary transistor fingers may be located within either or both of the ancillary regions 351, 352, whereas the primary transistor fingers are located outside of the ancillary regions 351, 352. Essentially, the ancillary transistor fingers are composed of a plurality of elongated ancillary gate structures 336-2, 336-3 (or gate fingers) (eight shown), elongated ancillary drain contacts 338-2, 338-3 (or drain fingers) (four shown), and the source contacts 340 formed within the build-up structure 390. It may be noted at this point that the source contacts 340 are shared between the primary and ancillary transistor fingers, in the illustrated embodiment. In alternate embodiments, distinct source contacts may be included for the primary and ancillary transistor fingers.

The ancillary drain and source contacts 338-2, 338-3, 340 are arranged in a substantially parallel configuration, with an ancillary gate structure 336-2, 336-3 positioned between sets of adjacent ancillary drain and source contacts 338-2, 338-3, 340. Given this arrangement, the ancillary gate structures, ancillary drain contacts, and source contacts 336-2, 336-3, 338-2, 338-3, 340 may be referred to as "interdigitated." Further, each arrangement of an adjacent ancillary drain contact 338-2, 338-3, ancillary gate structure 336-2, 336-3, and source contact 340 may be referred to herein as an "ancillary transistor finger" or an "ancillary transistor element" (e.g., ancillary transistor finger/element 339). Each ancillary transistor finger/element 339 is configured so that, during operation, current from the ancillary source contact 340 to the ancillary drain contact 338-2 or 338-3 also flows in the same direction (i.e., the "first direction") as the current within the primary transistor finger/element 341 (e.g., a horizontal direction in the orientation of FIG. 3A). In other words, the primary and ancillary transistor fingers/elements 341, 339 support current flow in parallel directions (i.e., the same direction). Accordingly, in the embodiment of FIG. 3A, the primary and ancillary transistor fingers/elements 341, 339 may be considered to be oriented parallel to each other.

According to an embodiment, the primary and ancillary gate structures 336-1, 336-2, 336-3 are arranged in parallel. Ancillary gate structures 336-2 within the input side ancillary regions 351 (referred to as "input side ancillary gate structures") are coupled together by one or more conductive ancillary gate busses 343, which in turn are connected to the input bond pad 344. More specifically, the input bond pad 344 is coupled to the ancillary gate busses 343 at an input side of FET segment 300. One or more conductive vias and/or portions of intermediate conductive layers may be used to electrically connect the ancillary gate busses 343 and the input bond pad 344.

Further, each of the ancillary gate structures 336-3 within the output side ancillary regions 352 (referred to as "output side ancillary gate structures") are electrically coupled to a point along one of the primary gate structures 336-1, thus electrically coupling each of the output side ancillary gate structures 336-3 to one of the primary gate busses 342 and, thus, to the input bond pad 344. Although the output side ancillary gate structures 336-3 are shown to be coupled to intermediate points between proximal (i.e., input side) and distal (i.e., output side) ends of the primary gate structures 336-1, in alternate embodiments, the output side ancillary gate structures 336-3 may be coupled to the distal ends of the primary gate structures 336-1, or may otherwise be electrically connected to the input bond pad 344.

Figure 3A:
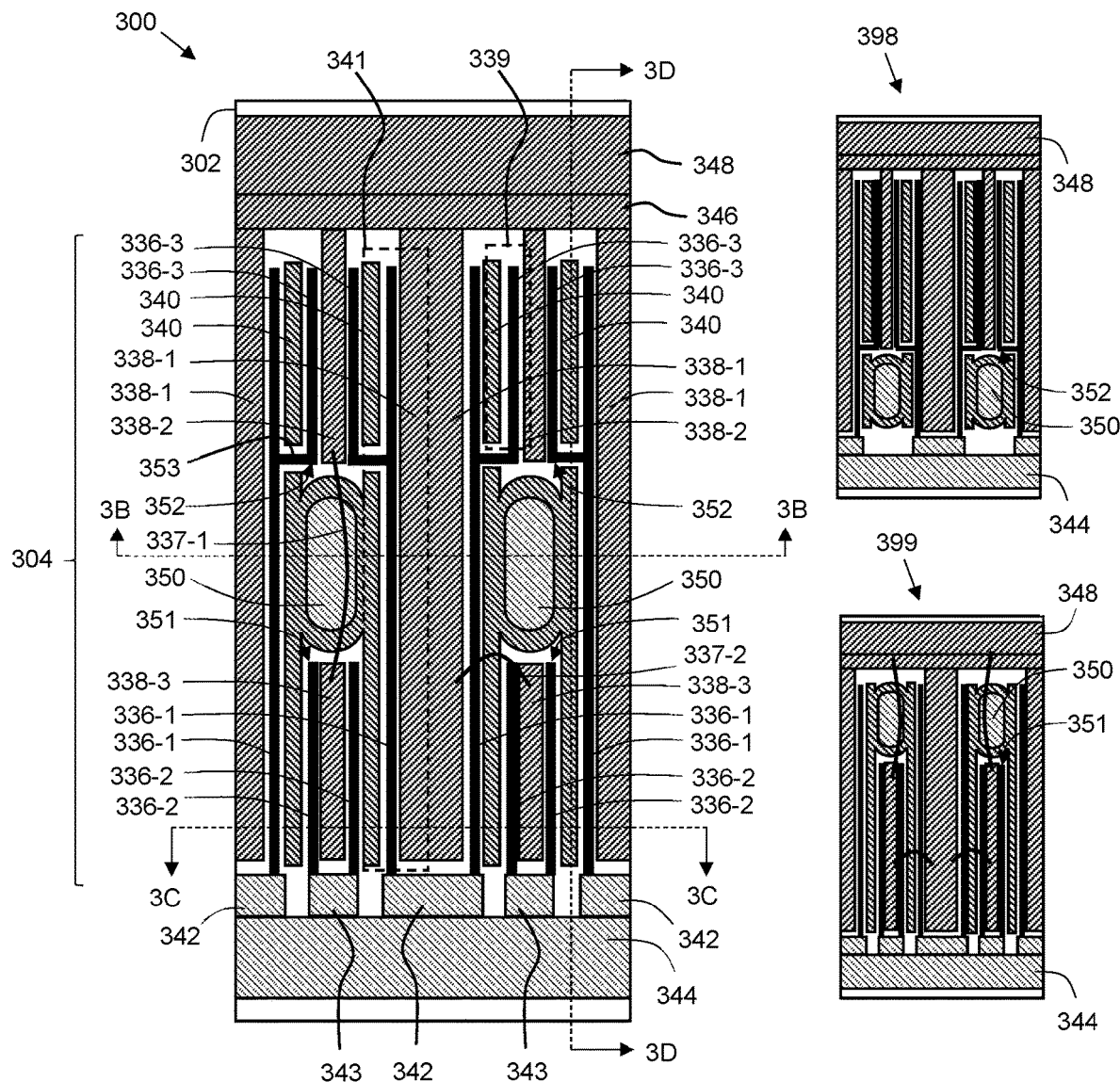
FIGS. 3A, 3B, 3C, and 3D (referred to collectively herein as FIG. 3) show top and side, cross-sectional views of a layout of a FET segment with primary and ancillary transistor elements, in accordance with an embodiment.
Figure 3B:
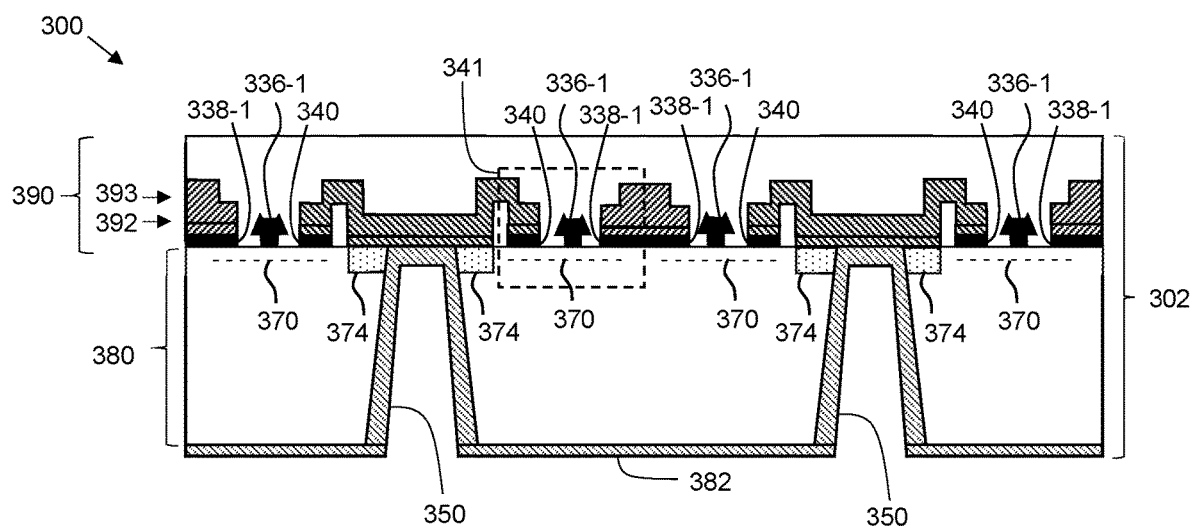
Figure 3C:
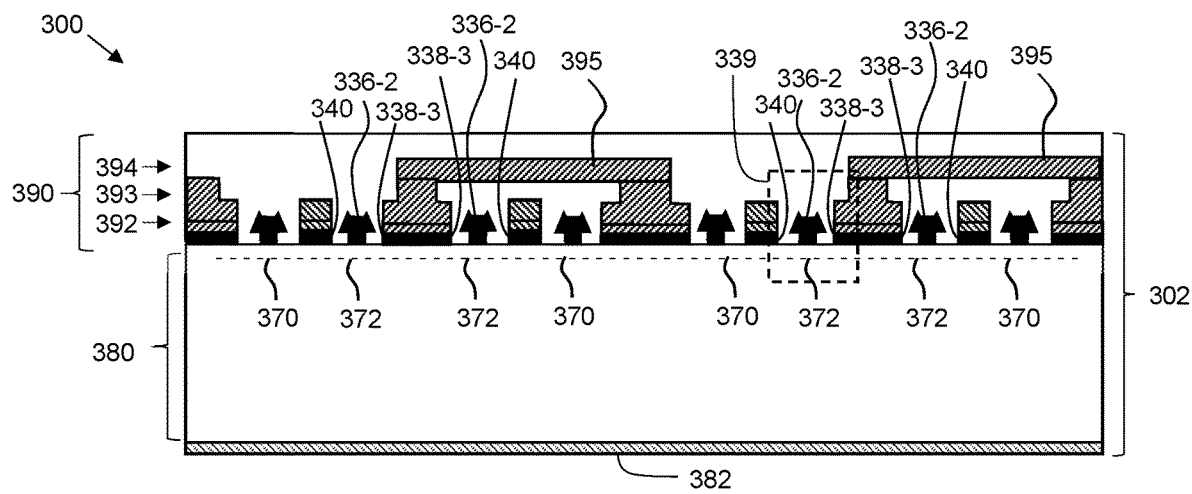
Figure 3D:
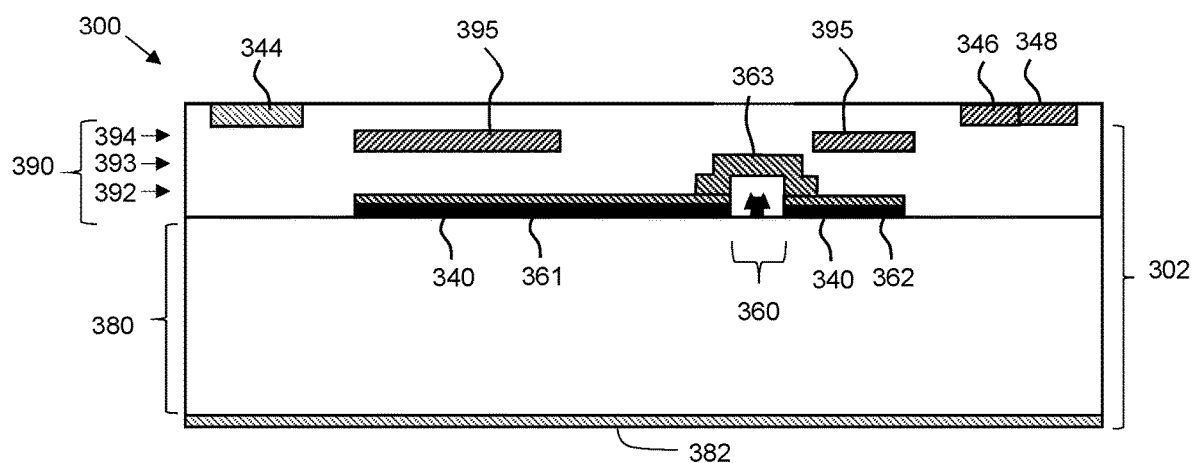

As shown in FIG. 3A, the conductive connection between an output side ancillary gate structure 336-3 and a primary gate structure 336-1 may be made with a conductive connection 353 that extends perpendicularly between an output side ancillary gate structure 336-3 and a primary gate structure 336-1. The conductive connection 353 may have the same structure as the gate structures, in some embodiments, or the conductive connection 353 may be formed from portion(s) of patterned conductive layer(s) in the build-up structure 390. In some embodiments, and as shown in FIG. 3D, in order to accommodate the conductive connections 353 without shorting the gate structures to the source contacts 340, a gap 360 in each source contact 340 may be present where the conductive connection 353 traverses between the primary gate structure 336-1 and the output side ancillary gate structure 336-3. In such an embodiment, the input side portion 361 of the source contact 340 and the output side portion 362 of the source contact 340 that are physically separated by the gap 360 may be electrically connected together using a conductive bridge 363 formed from portions of one or more of the patterned conductive layers 392-394 and conductive vias of the build-up structure 390.

The ancillary drain contacts 338-2 on the output side of FET segment 300 also are electrically coupled to the drain bus 346, which in turn is connected to the output bond pad 348. For example, the drain metallization that is electrically coupled to the ancillary drain contacts 338-2 may include a portion of the uppermost conductive layer 394, which is directly connected to the drain bus 348 and output bond pad 348, both of which also may be formed from portions of the uppermost conductive layer 394. The ancillary drain contacts 338-3 on the input side of FET segment 300 also are electrically coupled to the drain bus 346, although that electrical coupling utilizes additional portions (not illustrated) of upper conductive layers that extend between the input and output sides of the FET segment 300. Said more generally, the ancillary drain contacts 338-2, 338-3 may be electrically coupled to a primary drain contact 338-1 and/or to the drain bus 346 using drain metallization composed of various conductive connections formed from portions of one or more of the patterned conductive layers 392-394 (e.g., including portions 395, FIGS. 3C, 3D) and conductive vias of the build-up structure 390. In various alternate embodiments, the ancillary drain contact 338-3 at the input side may be electrically coupled to the ancillary drain contact 338-2 at the output side, to a primary drain contact 338-1, and/or to the drain bus 346 or output bond pad 348 using wirebonds (e.g., wirebond 337-1 and/or 337-2) or other conductive connections.

As best shown in FIGS. 3B and 3C, a channel 370 underlies each set of adjacent primary drain contacts, primary gate structures, and source contacts 338-1, 336-1, 340 within each primary transistor element 341, thus providing for current to flow through the upper portion of the base substrate 380 between primary drain and source contacts 338-1, 340 in response to electrical signals applied to the input bond pad 344 and the primary gate structures 336-1. More particularly, during operation of a transistor die that includes one or more instances of FET segment 300, current flow through the primary transistor fingers is in a first direction (i.e., a horizontal direction in FIG. 3A). More particularly, referring to FIGS. 3A and 3B, source current flows from the ground reference node (e.g., conductive layer 382 on the bottom of the substrate 302) through the source TSV 350, through source metallization (not shown) in the build-up structure 390 to the source contacts 340, through the channels 370 in response to input signals received at the input bond pad 344/gate structures 336-1, and through the primary drain contacts 338-1 and any drain metallization (not shown) to the output bond pad 348.

Similarly, a channel 372 underlies each set of adjacent ancillary drain contacts, ancillary gate structures, and source contacts 338-2, 338-3, 336-2, 336-3, 340 within each ancillary transistor element 339, thus providing for current to flow through the upper portion of the base substrate 380 between ancillary drain and source contacts 338-2, 338-3, 340 in response to electrical signals applied to the ancillary gate structures 336-2, 336-3. More particularly, during operation of a transistor die that includes one or more instances of FET segment 300, current flow through the ancillary transistor fingers also is in the first direction (i.e., a horizontal direction in FIG. 3A). More particularly, referring to FIGS. 3A, 3B, and 3C, source current flows from the ground reference node (e.g., conductive layer 382 on the bottom of the substrate 302) through the source TSV 350, through source metallization (not shown) in the build-up structure 390 to the source contacts 340, through the channels 372 in response to input signals received at the input bond pad 344/gate structures 336-2, and through the ancillary drain contacts 338-2, 338-3 and any drain metallization (not all of which is shown) to the output bond pad 348. As indicated by the above description, it is apparent that the direction of current flow through the primary transistor elements (e.g., primary transistor element 341) is parallel with the direction of current flow through the ancillary transistor elements (e.g., ancillary transistor element 339). Each transistor element may be electrically isolated from the source TSVs 350 with isolation regions 374 at and below the top surface of the base substrate 380.

As most clearly seen in FIG. 3A, the lengths (vertical dimension in FIG. 3A) of each of the primary gate structures 336-1 are substantially equal to each other. The input side ancillary gate structures 336-2 also have substantially equal lengths as each other, and the output side ancillary gate structures 336-3 also have substantially equal lengths as each other, although the lengths of the ancillary gate structures 336-2, 336-3 are substantially shorter (e.g., half or less) the lengths of the primary gate structures 336-1. As also apparent from FIG. 3A, the primary and ancillary gate structures 336-1, 336-2, 336-3 all are arranged in parallel.

Similarly, the lengths (vertical dimension in FIG. 3A) of each of the primary drain contacts 338-1 are substantially equal to each other. The lengths of each of the ancillary drain contacts 338-2, 338-3 also are substantially equal to each other, although the lengths of the ancillary drain contacts 338-2, 338-3 are substantially shorter (e.g., half or less) the lengths of the primary drain contacts 338-1. The primary and ancillary drain contacts 338-1, 338-2, 338-3 all are arranged in parallel.

Finally, the lengths (vertical dimension in FIG. 3A) of each of the source contacts 340 also are substantially equal, and the source contacts 340 are arranged in parallel. However, as indicated above, a gap 360 may be present between input and output portions 361, 362 of each source contact 340.

According to an embodiment, during operation of a transistor die that includes one or more instances of FET segment 300, both the primary and ancillary transistor elements contribute to the total power provided by the transistor die. Essentially, the ancillary transistor elements add to the power provided by the primary transistor elements. Desirably, the ancillary transistor elements have lengths that are maximized within the ancillary regions 351, 352 in order to maximize the amount of power contributed by the ancillary transistor elements (i.e., the length of the ancillary transistor elements is only slightly smaller than the lengths (vertical dimension in FIG. 3A) of the ancillary regions 351, 352). Further, although FIG. 3A shows two ancillary transistor elements within each ancillary region 351, 352, with a shared drain region 338-2, 338-3, in other embodiments, each ancillary region 351, 352 may include only one ancillary transistor element, or may include more than two ancillary transistor elements.

Referring now to FIG. 4 (including FIGS. 4A, 4B, 4C, 4D, and 4E), various views of a layout of a FET segment 400 are shown, in accordance with another embodiment of the present invention. More specifically, FIG. 4A shows a top view of FET segment 400, FIG. 4B is a cross-sectional view of the FET segment 400 of FIG. 4A through line 4B-4B, FIG. 4C is a cross-sectional view of the FET segment 400 of FIG. 4A through line 4C-4C, FIG. 4D is a cross-sectional view of the FET segment 400 of FIG. 4A through line 4D-4D, and FIG. 4E is a cross-sectional view of the FET segment 400 of FIG. 4A through line 4E-4E. It should be noted that, in the upper right corner of FIG. 4A, an enlarged view of ancillary region 452 is depicted in order to better show the details of that region. According to an embodiment, ancillary region 451 essentially is a mirror image (flipped upside-down) of ancillary region 452, and accordingly the details depicted in the upper-right enlarged view are analogous to the details in ancillary region 451.

FET segment 400 may employ a multi-layer circuit configured integrally formed within a semiconductor substrate 402. As best shown in FIGS. 4B-4E, the semiconductor substrate 402 includes a base semiconductor substrate 480 (or "base substrate") and a build-up structure 490 coupled to the top surface of the base substrate 480. The base semiconductor substrate 480 may be formed, for example, from bulk or composite semiconductor materials (e.g., Si, GaN, GaAs, SoI, GaN-on-insulator (e.g., GaN on Si, GaN on silicon carbide, GaN on sapphire, and so on), or other suitable materials).

The build-up structure 490 includes multiple dielectric layers (not numbered) that separate multiple patterned conductive layers 492, 493, 494, along with conductive vias (not numbered) that electrically connect portions of the conductive layers 492-494. Portions of the conductive layers 492-494 may be referred to as "metallization" herein (e.g., "source metallization," "drain metallization," and so on). Conductive layers 492-494 provide electrical connections between structures at the surface of base substrate 480 (e.g., gate structures and drain/source contacts) and input and output terminals (e.g., input and output bond pads 444, 448) that are exposed at the top surface of the build-up structure 490. Although FIG. 4 (and more specifically FIG. 4E) shows three conductive layers 492-494, in other embodiments, more or fewer conductive layers may be included in the build-up structure 490. In addition, although various features are illustrated within particular ones of the conductive layers 492-494, such features may be located in different layers than those depicted.

FET segment 400 includes an input bond pad 444 (or input terminal) proximate a first side of the die in which FET segment 400 is included, an output bond pad 448 (or output terminal) proximate an opposite, second side of the die in which FET segment 400 is included, and a central region 404 between the input and output bond pads 444, 448. It should be noted that, in some embodiments, the input and output bond pads 444, 448 may be implemented as other types of conductive I/O structures that are not necessarily "bond pads" (e.g., structures suitable for attaching wire-bonds), and thus structures 444, 448 should be thought of more generally as I/O terminals.

The central region 404 includes multiple "primary" and "ancillary" transistor fingers, according to an embodiment. Although each of the various transistor fingers essentially include the same functional transistor structures (e.g., a gate structure, drain/source contacts, and a channel), the terms "primary" and "ancillary" are used to differentiate transistor fingers that are located outside of ancillary regions 451, 452 or within ancillary regions 451, 452, respectively.

One or more source TSVs 450 are positioned within the central region 404 between the input and output terminals 444, 448. The source TSVs 450 are electrically connected to each source contact 440 (described later) through "source metallization," which includes various conductive vias and portions of conductive layers in the build-up structure 490. In the FET segment 400, each source TSVs 450 is electrically coupled to two groups of source contacts 440, 441: one group on the input side of the source TSV 450, and another group on the output side of the source TSV 450. As shown in FIG. 4B, the source TSVs 450 extend through the base substrate 480 and serve to electrically connect the source contacts 440 to a ground reference node (e.g., conductive layer 482) on a lower surface of base substrate 480.

Associated with each source TSV 450, a first "input side" ancillary region 451 is present on the input side (i.e., between the source TSV 450 and the input bond pad 444), and a second "output side" ancillary region 452 is present on the output side (i.e., between the source TSV 450 and the output bond pad 448). In another embodiment, and as shown in alternate FET segment 498 in FIG. 4A, the source TSV 450 may be positioned closer to the input bond pad 444, and only a single, output side ancillary region 452 may be provided between the source TSV 450 and the output bond pad 448. In another alternate embodiment, and as shown in alternate FET segment 499 in FIG. 4A, the source TSV 450 may be positioned closer to the output bond pad 448, and only a single, input side ancillary region 451 may be provided between the source TSV 450 and the input bond pad 444. In still other embodiments, multiple source TSVs 450 may be included along an axis between the input and output bond pads 444, 448, and an ancillary region may be provided between those multiple source TSVs 450.

The primary transistor fingers will be defined first. Essentially, the primary transistor fingers are composed of a plurality of elongated primary gate structures 436-1 (or gate fingers) (four shown), elongated primary drain contacts 438-1 (or drain fingers) (four shown, noting that the two central drain contacts 438-1 are electrically coupled through drain metallization formed from a portion of conductive layer 493), and source contacts 440, 441 (or source fingers) (multiple shown in the enlarged, upper-right view) formed within the build-up structure 490. Again, as used herein, the term "contact" refers to an electrically conductive feature that directly contacts the top surface of the base substrate 480 (although a contact may be recessed below the top surface, as well) proximate to a first or second end of a channel 470 within the base substrate 480. According to an embodiment, the drain and source contacts 438-1, 438-2, 440, 441 may be ohmic contacts. In FIG. 4, and to assist with clarity, source metallization is depicted with cross-hatched elements, with the cross-hatching going from upper left to lower right, whereas drain metallization is depicted with cross-hatched elements, with the cross-hatching going from lower left to upper right.

The primary drain and source contacts 438-1, 440, 441 are arranged in a substantially parallel configuration, with a primary gate structure 436-1 positioned between and oriented in parallel with the set of adjacent primary drain and source contacts 438-1, 440, 441, thus defining a "primary transistor finger" or a "primary transistor element" (e.g., primary transistor finger/element 443). Given this arrangement, the primary gate structures, primary drain contacts, and source contacts 436-1, 438-1, 440 may be referred to as "interdigitated." Each primary transistor finger/element is configured so that, during operation, current from the primary source contact 440 to the primary drain contact 438-1 flows in a first direction (e.g., a horizontal direction in the orientation of FIG. 4A).

The primary gate structures 436-1 are coupled together by one or more conductive primary gate busses 442, which in turn are connected to the input bond pad 444. More specifically, the input bond pad 444 is coupled to primary gate busses 442 at an input side of FET segment 400. One or more conductive vias and/or portions of intermediate conductive layers may be used to electrically connect the primary gate busses 442 and the input bond pad 444.

Similarly, the primary drain contacts 438-1 are coupled together by a conductive drain bus 446, which in turn is connected the output bond pad 448. More specifically, the output bond pad 448 is coupled to drain bus 446 at an output side of FET segment 400. According to an embodiment, the drain bus 446 and the output bond pad 448 are formed from portions of an uppermost conductive layer 494, although in other embodiments, one or more conductive vias and/or portions of intermediate conductive layers may be used to electrically connect the drain bus 446 and the output bond pad 448.

The ancillary transistor fingers will now be defined. As indicated above and reflected in FIG. 4, the ancillary transistor fingers may be located within either or both of the ancillary regions 451, 452, whereas the primary transistor fingers are located outside of the ancillary regions 451, 452. Referring to the upper-right enlarged view of ancillary region 452, the ancillary transistor fingers are composed of a plurality of ancillary gate structures 436-2 (or gate fingers) (eight shown in the enlarged view), ancillary drain contacts 438-2 (or drain fingers) (two shown in the enlarged view), and the source contacts 441 formed within the build-up structure 490. It may be noted at this point that the source contacts 441 are shared between the primary and ancillary transistor fingers, in the illustrated embodiment, whereas source contacts 440 are functional elements only of the primary transistor fingers (e.g., finger 443).

The ancillary drain and source contacts 438-2, 441 are arranged in a substantially parallel configuration, with an ancillary gate structure 436-2 positioned between sets of adjacent ancillary drain and source contacts 438-2, 441. Given this arrangement, the ancillary gate structures, ancillary drain contacts, and source contacts 436-2, 438-2, 441 may be referred to as "interdigitated." Further, each arrangement of an adjacent ancillary drain contact 438-2, ancillary gate structure 436-2, and source contact 441 may be referred to herein as an "ancillary transistor finger" or an "ancillary transistor element" (e.g., ancillary transistor finger/element 439 in the enlarged view). Each ancillary transistor finger/element is configured so that, during operation, current from the ancillary source contact 441 to the ancillary drain contact 438-2 flows in a perpendicular direction from the current within the primary transistor finger/element (e.g., a vertical direction in the orientation of FIG. 4A). In other words, the primary and ancillary transistor fingers/elements support current flow in perpendicular directions (i.e., different directions). Accordingly, in the embodiment of FIG. 4A, the primary and ancillary transistor fingers/elements may be considered to be oriented perpendicular to each other.

According to an embodiment, the ancillary gate structures 436-2 each are electrically coupled to a different point along one of the primary gate structures 436-1, and the ancillary gate structures 436-2 extend perpendicularly from the primary gate structures 436-1 toward the center of each ancillary region 451, 452. Accordingly, the input bond pad 444 is coupled to the ancillary gate structures 436-2 through the primary gate structures 436-1. In the embodiment of FIG. 4, within any ancillary region 451, 452, first ancillary gate structures 436-2 extend from their proximal ends, which are coupled to a first (e.g., left) primary gate structure 436-1, to their distal ends, which terminate before reaching a second (e.g., right) primary gate structure 436-1. Similarly, second ancillary gate structures 436-2 extend from their proximal ends, which are coupled to the second (e.g., right) primary gate structure 436-1, to their distal ends, which terminate before reaching the first (e.g., left) primary gate structure 436-1. As can be seen in the enlarged view in FIG. 4A, a gap 461 is present between the distal ends of the aforementioned first and second ancillary gate structures 436-2. The gap 461 may be included, in particular, when a lift-off process is utilized to form the gate structures 436-1, 436-2, as "donut" shaped structures are not readily achievable using a lift-off process. In an alternate embodiment (e.g., an embodiment in which the gate structures 436-1, 436-2 are formed using implantation or another process), the gap 461 may be eliminated, and some or all of the ancillary gate structures 436-2 may extend and be electrically-coupled across the entire distance between the primary gate structures 436-1 on the opposite sides of the ancillary regions 451, 452. In another alternate embodiment, as will be described in more detail in conjunction with FIGS. 5-7, each ancillary gate structure 436-2 may extend from only one of the primary gate structures 436-1 on the left or right side of each ancillary region 451, 452, with distal ends of such ancillary gate structures 436-2 being separated from the opposite primary gate structure 436-1 by a gap (e.g., gap 561, 661, 761, FIGS. 5-7).

Although the ancillary gate structures 436-2 are shown to be coupled to intermediate points between proximal (i.e., input side) and distal (i.e., output side) ends of the primary gate structures 436-1, in alternate embodiments, the ancillary gate structures 436-2 may otherwise be electrically connected to the input bond pad 444.

Figure 4A:
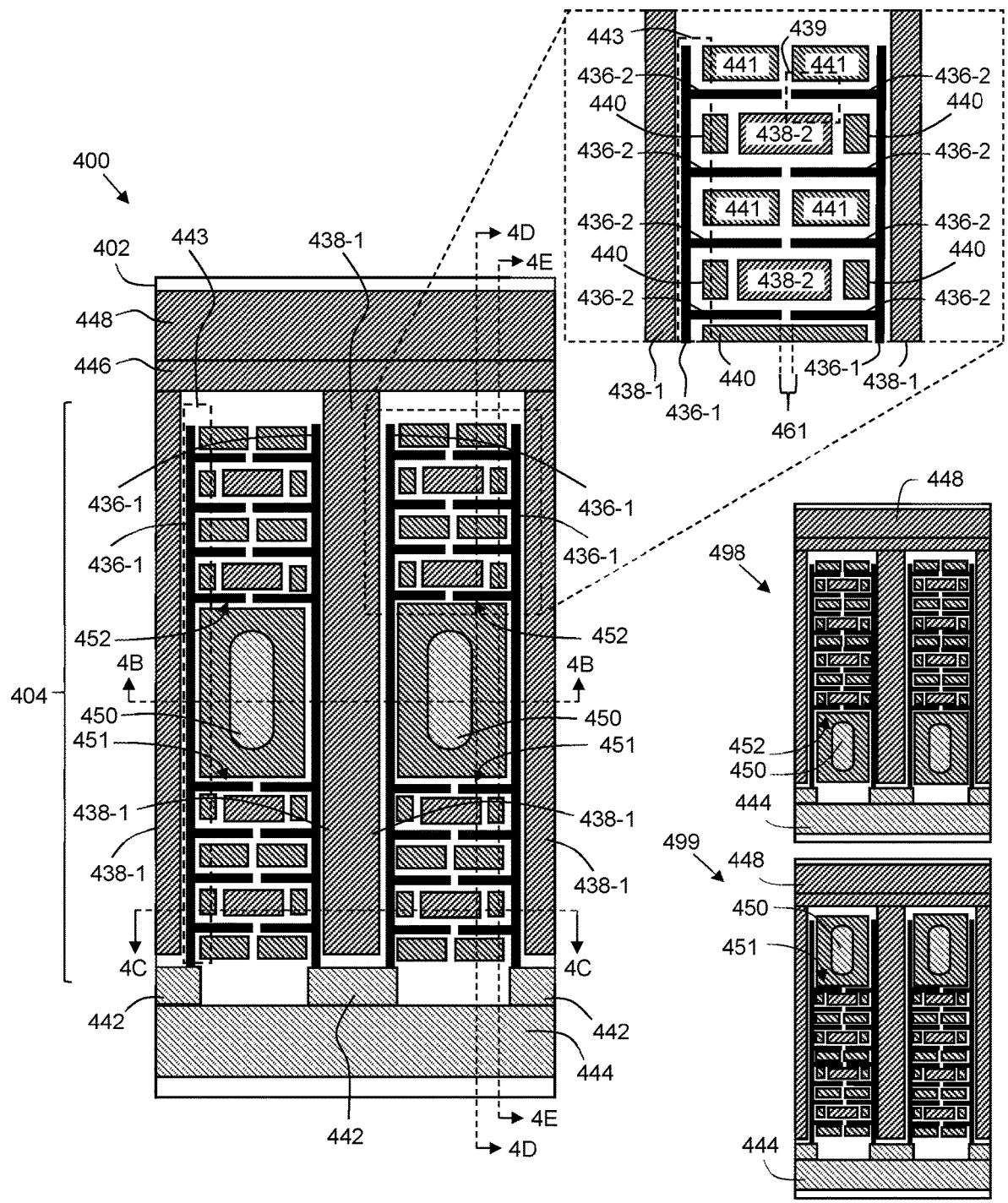
FIGS. 4A, 4B, 4C, 4D, and 4E (referred to collectively herein as FIG. 4) show top and side, cross-sectional views of a layout of a FET segment with primary and ancillary transistor elements, in accordance with another embodiment.
Figure 4B:
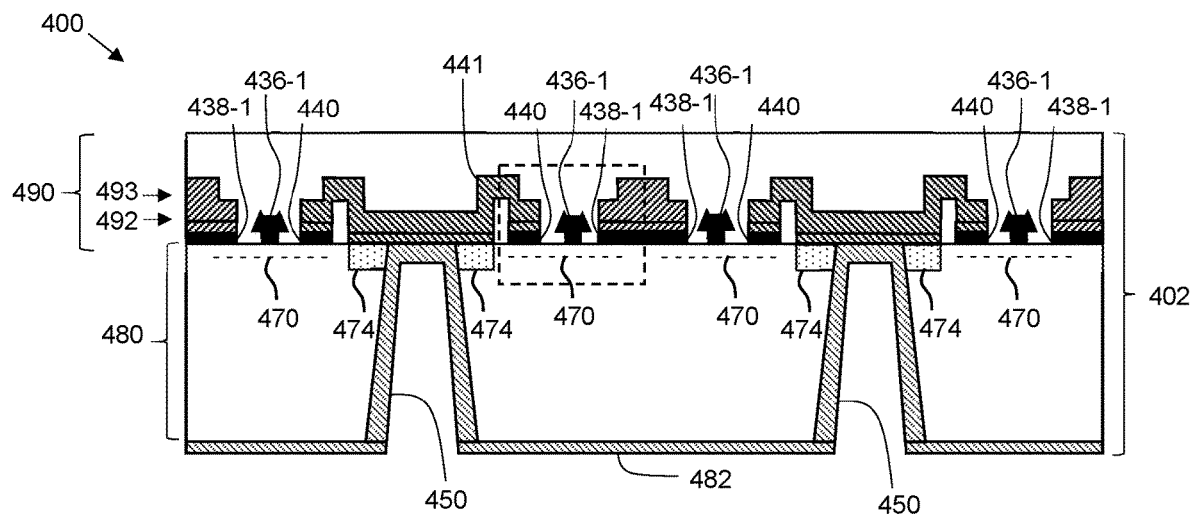
Figure 4C:
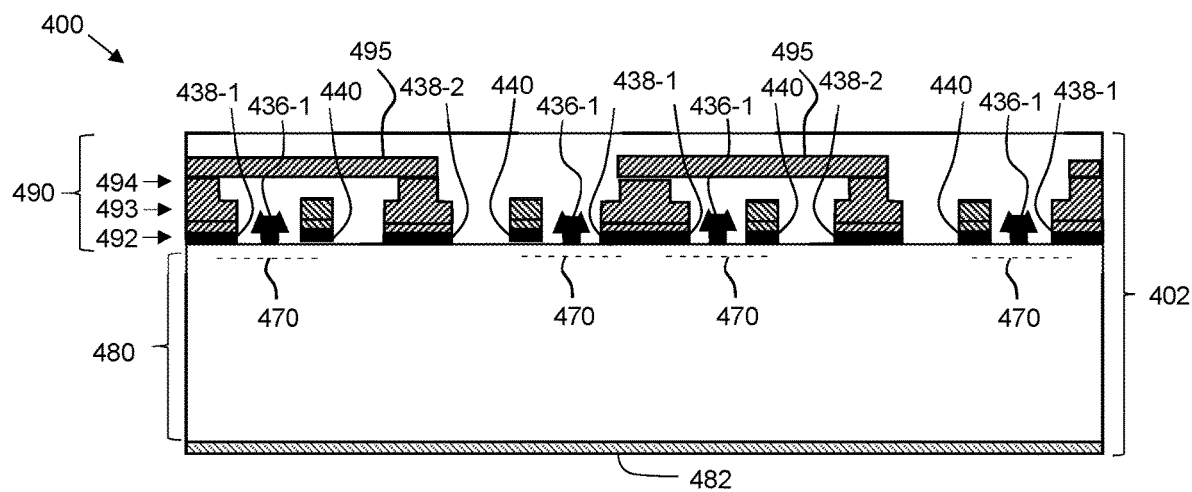
Figure 4D:
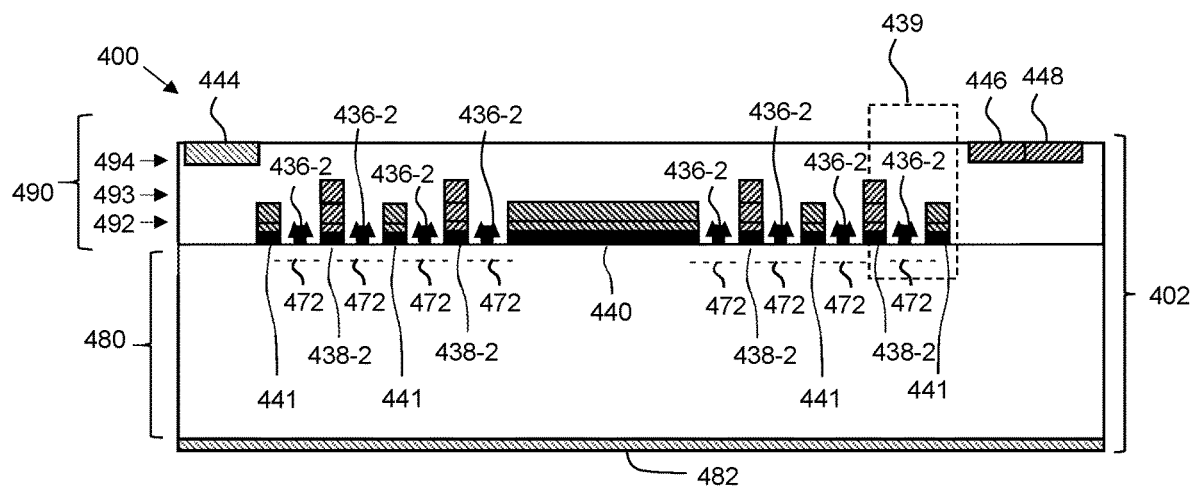
Figure 4E:
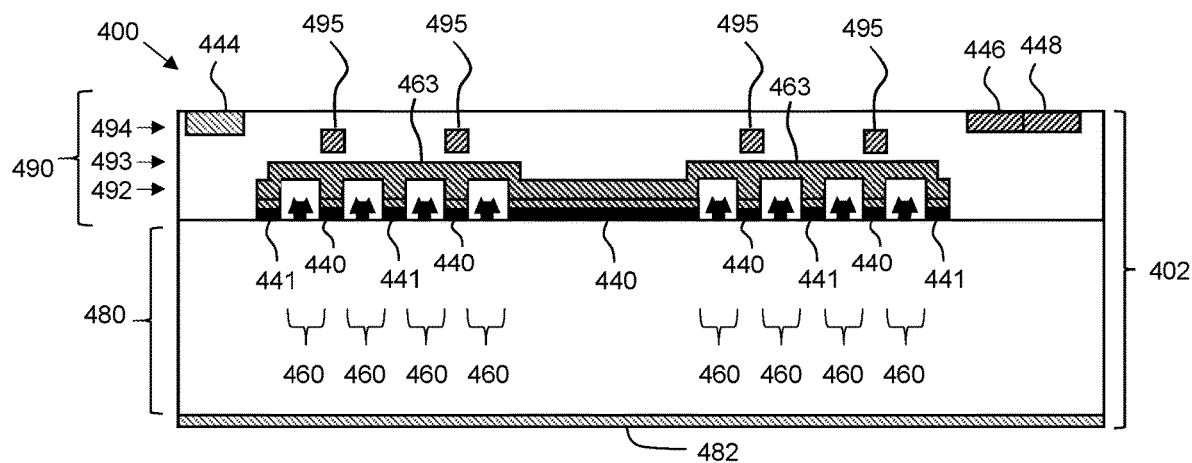

In some embodiments, and as shown in FIG. 4E, in order to accommodate the ancillary gate structures 436-2 without shorting the ancillary gate structures 436-2 to the source contacts 440, 441, gaps 460 between source contacts 440, 441 may be present where each ancillary gate structure 436-2 traverses between the primary gate structure 436-1 and the distal end of the ancillary gate structure 436-2. In such an embodiment, the source contacts 440, 441 that are physically separated by a gap 460 may be electrically connected together using a conductive bridge 463 formed from portions of one or more of the patterned conductive layers 492-494 and conductive vias of the build-up structure 490.

The ancillary drain contacts 438-2 also are electrically coupled to the drain bus 446, which in turn is connected to the output bond pad 448. Although not depicted in FIG. 4, the ancillary drain contacts 438-2 may be electrically coupled to a primary drain contact 438-1 and/or to the drain bus 446 using drain metallization composed of various conductive connections formed from portions of one or more of the patterned conductive layers 492-494 (e.g., portions 495, FIG. 4C, 4E) and conductive vias of the build-up structure 490. In various alternate embodiments, the ancillary drain contacts 438-2 may be electrically coupled to the primary drain contact 438-1, and/or to the drain bus 446 or output bond pad 448 using wirebonds (not shown) or other conductive connections.

As best shown in FIGS. 4B and 4C, a channel 470 underlies each set of adjacent primary drain contacts, primary gate structures, and source contacts 438-1, 436-1, 440 within each primary transistor element 443, thus providing for current to flow through the upper portion of the base substrate 480 between primary drain and source contacts 438-1, 440 in response to electrical signals applied to the input bond pad 444 and the primary gate structures 436-1. More particularly, during operation of a transistor die that includes one or more instances of FET segment 400, current flow through the primary transistor fingers is in a first direction (i.e., a horizontal direction in FIG. 4A). More particularly, referring to FIGS. 4A and 4B, source current flows from the ground reference node (e.g., conductive layer 482 on the bottom of the substrate 402) through the source via 450, through source metallization (not shown) in the build-up structure 490 to the source contacts 440, 441, through the channels 470 in response to input signals received at the input bond pad 444/gate structures 436-1, and through the primary drain contacts 438-1 and any drain metallization (not shown) to the output bond pad 448.

Similarly, as best shown in FIG. 4D, a channel 472 underlies each set of adjacent ancillary drain contacts, ancillary gate structures, and source contacts 438-2, 436-2, 441 within each ancillary transistor element 439, thus providing for current to flow through the upper portion of the base substrate 480 between ancillary drain and source contacts 438-2, 441 in response to electrical signals applied to the ancillary gate structures 436-2. More particularly, during operation of a transistor die that includes one or more instances of FET segment 400, current flow through the ancillary transistor fingers is in a second direction (i.e., a vertical direction in FIG. 4A). More particularly, referring to FIGS. 4A, 4B, and 4D, source current flows from the ground reference node (e.g., conductive layer 482 on the bottom of the substrate 402) through the source via 450, through source metallization (not shown) in the build-up structure 490 to the source contacts 441, through the channels 472 in response to input signals received at the input bond pad 444/gate structures 436-2, and through the ancillary drain contacts 438-2 and any drain metallization (not shown) to the output bond pad 448. As indicated by the above description, it is apparent that the direction of current flow through the primary transistor elements (e.g., primary transistor element 443) is orthogonal to (i.e., perpendicular to) the direction of current flow through the ancillary transistor elements (e.g., ancillary transistor element 439). Each transistor element may be electrically isolated from the source TSVs 450 with isolation regions 474 at and below the top surface of the base substrate 480.

As most clearly seen in FIG. 4A, the lengths (vertical dimension in FIG. 4A) of each of the primary gate structures 436-1 are substantially equal to each other. In addition, the ancillary gate structures 436-2 also have substantially equal lengths as each other, although the lengths of the ancillary gate structures 436-2 are significantly shorter than the lengths of the primary gate structures 436-1. As also apparent from FIG. 4A, the ancillary gate structures 436-2 are arranged perpendicular to the primary gate structures 436-1.

Similarly, the lengths (vertical dimension in FIG. 4A) of each of the primary drain contacts 438-1 are substantially equal to each other. The lengths (horizontal dimension in FIG. 4A) of each of the ancillary drain contacts 438-2 also are substantially equal to each other, although the lengths of the ancillary drain contacts 438-2 are significantly shorter than the lengths of the primary drain contacts 438-1.

According to an embodiment, during operation of a transistor die that includes one or more instances of FET segment 400, both the primary and ancillary transistor elements contribute to the total power provided by the transistor die. Essentially, the ancillary transistor elements add to the power provided by the primary transistor elements. Desirably, the ancillary transistor elements have lengths that are maximized within the ancillary regions 451, 452 in order to maximize the amount of power contributed by the ancillary transistor elements. Further, although FIG. 4A shows eight ancillary transistor elements within each ancillary region 451, 452, in other embodiments, each ancillary region 451, 452 may include fewer or more ancillary transistor elements.

Figure 5:
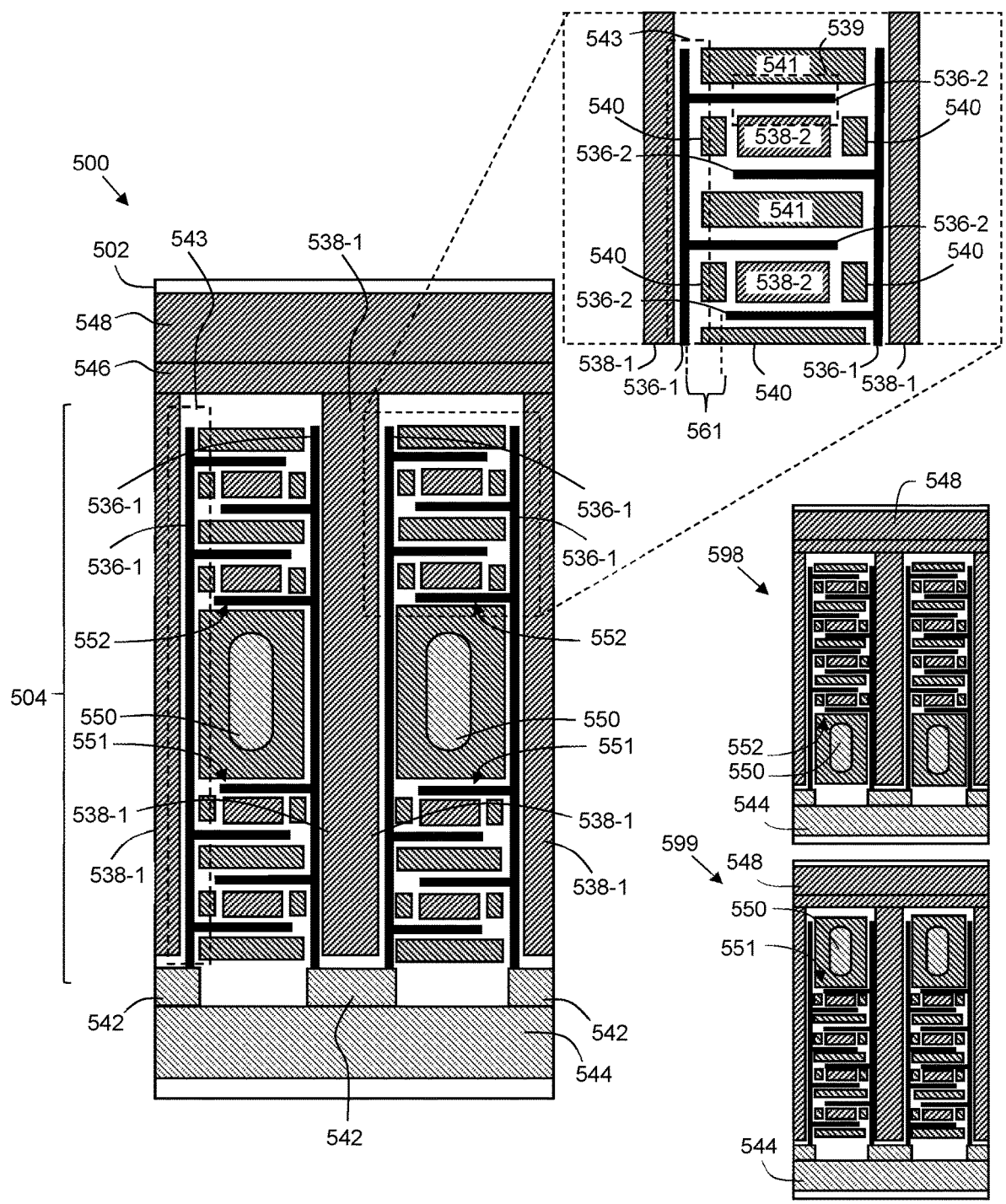
FIG. 5 shows a view of a layout of a FET segment with primary and ancillary transistor elements, in accordance with yet another embodiment.

FIG. 5 shows a top view of FET segment 500, in accordance with another alternate embodiment. It should be noted that, in the upper right corner of FIG. 5, an enlarged view of ancillary region 552 is depicted in order to better show the details of that region. According to an embodiment, ancillary region 551 essentially is a mirror image (flipped upside-down) of ancillary region 552, and accordingly the details depicted in the upper-right enlarged view are analogous to the details in ancillary region 551. Because FET segment 500 has many similarities to FET segment 400, cross-sectional views of FET segment 500 are not provided for succinctness.

Again, FET segment 500 may employ a multi-layer circuit configured integrally formed within a semiconductor substrate 502. The semiconductor substrate 502 includes a base semiconductor substrate (or "base substrate," such as base substrate 480, FIG. 4B) and a build-up structure (e.g., similar to build-up structure 490, FIG. 4B, but with modifications to implement the embodiment of FIG. 5) coupled to the top surface of the base substrate. The base semiconductor substrate may be formed, for example, from bulk or composite semiconductor materials (e.g., Si, GaN, GaAs, SoI, GaN-on-insulator (e.g., GaN on Si, GaN on silicon carbide, GaN on sapphire, and so on), or other suitable materials).

The build-up structure includes multiple dielectric layers that separate multiple patterned conductive layers, along with conductive vias that electrically connect portions of the conductive layers. The conductive layers provide electrical connections between structures at the surface of base substrate (e.g., gate structures and drain/source contacts) and input and output terminals (e.g., input and output bond pads 544, 548) that are exposed at the top surface of the build-up structure.

FET segment 500 includes an input bond pad 544 (or input terminal) proximate a first side of the die in which FET segment 500 is included, an output bond pad 548 (or output terminal) proximate an opposite, second side of the die in which FET segment 500 is included, and a central region 504 between the input and output bond pads 544, 548. It should be noted that, in some embodiments, the input and output bond pads 544, 548 may be implemented as other types of conductive I/O structures that are not necessarily "bond pads" (e.g., structures suitable for attaching wirebonds), and thus structures 544, 548 should be thought of more generally as I/O terminals.

The central region 504 includes multiple "primary" and "ancillary" transistor fingers, according to an embodiment. Although each of the various transistor fingers essentially include the same functional transistor structures (e.g., a gate structure, drain/source contacts, and a channel), the terms "primary" and "ancillary" are used to differentiate transistor fingers that are located outside of ancillary regions 551, 552 or within ancillary regions 551, 552, respectively.

One or more source TSVs 550 are positioned within the central region 504 between the input and output terminals 544, 548. The source TSVs 550 are electrically connected to each source contact 540 (described later) through "source metallization," which includes various conductive vias and portions of conductive layers in the build-up structure. In the FET segment 500, each source TSVs 550 is electrically coupled to two groups of source contacts 540, 541: one group on the input side of the source TSV 550, and another group on the output side of the source TSV 550. The source TSVs 550 extend through the base substrate and serve to electrically connect the source contacts 540 to a ground reference node (e.g., a conductive layer) on a lower surface of base substrate.

Associated with each source TSV 550, a first "input side" ancillary region 551 is present on the input side (i.e., between the source TSV 550 and the input bond pad 544), and a second "output side" ancillary region 552 is present on the output side (i.e., between the source TSV 550 and the output bond pad 548). In another embodiment, and as shown in alternate FET segment 598 in FIG. 5, the source TSV 550 may be positioned closer to the input bond pad 544, and only a single, output side ancillary region 552 may be provided between the source TSV 550 and the output bond pad 548. In another alternate embodiment, and as shown in alternate FET segment 599 in FIG. 5, the source TSV 550 may be positioned closer to the output bond pad 548, and only a single, input side ancillary region 551 may be provided between the source TSV 550 and the input bond pad 544. In still other embodiments, multiple source TSVs 550 may be included along an axis between the input and output bond pads 544, 548, and an ancillary region may be provided between those multiple source TSVs 550.

The primary transistor fingers will be defined first. Essentially, the primary transistor fingers are composed of a plurality of elongated primary gate structures 536-1 (or gate fingers) (four shown), elongated primary drain contacts 538-1 (or drain fingers) (four shown, noting that the two central drain contacts 538-1 are electrically coupled through drain metallization formed from a portion of a conductive layer), and source contacts 540, 541 (or source fingers) (multiple shown in the enlarged, upper-right view) formed within the build-up structure. Again, as used herein, the term "contact" refers to an electrically conductive feature that directly contacts the top surface of the base substrate (although a contact may be recessed below the top surface, as well) proximate to a first or second end of a channel (e.g., channel 470, FIG. 4C) within the base substrate. According to an embodiment, the drain and source contacts 538-1, 538-2, 540, 541 may be ohmic contacts. In FIG. 5, and to assist with clarity, source metallization is depicted with cross-hatched elements, with the cross-hatching going from upper left to lower right, whereas drain metallization is depicted with cross-hatched elements, with the cross-hatching going from lower left to upper right.

The primary drain and source contacts 538-1, 540, 541 are arranged in a substantially parallel configuration, with a primary gate structure 536-1 positioned between and oriented in parallel with the set of adjacent primary drain and source contacts 538-1, 540, 541, thus defining a "primary transistor finger" or a "primary transistor element" (e.g., primary transistor finger/element 543). Given this arrangement, the primary gate structures, primary drain contacts, and source contacts 536-1, 538-1, 540 may be referred to as "interdigitated." Each primary transistor finger/element is configured so that, during operation, current from the primary source contacts 540, 541 to the primary drain contact 538-1 flows in a first direction (e.g., a horizontal direction in the orientation of FIG. 5).

The primary gate structures 536-1 are coupled together by one or more conductive primary gate busses 542, which in turn are connected to the input bond pad 544. More specifically, the input bond pad 544 is coupled to primary gate busses 542 at an input side of FET segment 500. One or more conductive vias and/or portions of intermediate conductive layers may be used to electrically connect the primary gate busses 542 and the input bond pad 544.

Similarly, the primary drain contacts 538-1 are coupled together by a conductive drain bus 546, which in turn is connected to the output bond pad 548. More specifically, the output bond pad 548 is coupled to drain bus 546 at an output side of FET segment 500. According to an embodiment, the drain bus 546 and the output bond pad 548 are formed from portions of an uppermost conductive layer, although in other embodiments, one or more conductive vias and/or portions of intermediate conductive layers may be used to electrically connect the drain bus 546 and the output bond pad 548.

The ancillary transistor fingers will now be defined. As indicated above and reflected in FIG. 5, the ancillary transistor fingers may be located within either or both of the ancillary regions 551, 552, whereas the primary transistor fingers are located outside of the ancillary regions 551, 552. Referring to the upper-right enlarged view of ancillary region 552, the ancillary transistor fingers are composed of a plurality of ancillary gate structures 536-2 (or gate fingers) (four shown in the enlarged view), ancillary drain contacts 538-2 (or drain fingers) (two shown in the enlarged view), and the source contacts 541 formed within the build-up structure. It may be noted at this point that the source contacts 541 are shared between the primary and ancillary transistor fingers, in the illustrated embodiment, whereas source contacts 540 are functional elements only of the primary transistor fingers (e.g., finger 543).

The ancillary drain and source contacts 538-2, 541 are arranged in a substantially parallel configuration, with an ancillary gate structure 536-2 positioned between sets of adjacent ancillary drain and source contacts 538-2, 541. Given this arrangement, the ancillary gate structures, ancillary drain contacts, and source contacts 536-2, 538-2, 541 may be referred to as "interdigitated." Further, each arrangement of an adjacent ancillary drain contact 538-2, ancillary gate structure 536-2, and source contact 541 may be referred to herein as an "ancillary transistor finger" or an "ancillary transistor element" (e.g., ancillary transistor finger/element 539 in the enlarged view). Each ancillary transistor finger/element is configured so that, during operation, current from the ancillary source contact 541 to the ancillary drain contact 538-2 flows in a perpendicular direction from the current within the primary transistor finger/element (e.g., a vertical direction in the orientation of FIG. 5). In other words, the primary and ancillary transistor fingers/elements support current flow in perpendicular directions (i.e., different directions). Accordingly, in the embodiment of FIG. the primary and ancillary transistor fingers/elements may be considered to be oriented perpendicular to each other.

According to an embodiment, the ancillary gate structures 536-2 each are electrically coupled to a different point along one of the primary gate structures 536-1, and each ancillary gate structure 536-2 extends perpendicularly from a primary gate structure 536-1 on one side of an ancillary region 551, 552 through the center of the ancillary region 551, 552 and toward, but not to, a primary gate structure 536-1 on the opposite side of the ancillary region 551, 552. In the enlarged view of the embodiment of FIG. 5, going from the top ancillary gate structure 536-2 to the bottom ancillary gate structure 536-2, the ancillary gate structures 536-2 alternate between being electrically coupled to the primary gate structure 536-1 on one side of the ancillary region 552, and being electrically coupled to the primary gate structure 536-1 on the opposite side of the ancillary region 552. In an alternate embodiment, all of the ancillary gate structures 536-2 within an ancillary region 551, 552 may be electrically coupled to the same primary gate structure 536-1 on a single side of the ancillary region 551, 552.

In the embodiment of FIG. 5, within any ancillary region 551, 552, first ancillary gate structures 536-2 extend from their proximal ends, which are coupled to a first (e.g., left) primary gate structure 536-1, to their distal ends, which terminate before reaching a second (e.g., right) primary gate structure 536-1. Similarly, second ancillary gate structures 536-2 extend from their proximal ends, which are coupled to the second (e.g., right) primary gate structure 536-1, to their distal ends, which terminate before reaching the first (e.g., left) primary gate structure 536-1. As can be seen in the enlarged view in FIG. 5, a gap 561 is present between the distal ends of the aforementioned first and second ancillary gate structures 536-2 and the primary gate structures 536-1 to which the distal ends are not connected.

The input bond pad 544 is coupled to the ancillary gate structures 536-2 through the primary gate structures 536-1. Although the ancillary gate structures 536-2 are shown to be coupled to intermediate points between proximal (i.e., input side) and distal (i.e., output side) ends of the primary gate structures 536-1, in alternate embodiments, the ancillary gate structures 536-4 may otherwise be electrically connected to the input bond pad 544.

In some embodiments (e.g., as shown in FIG. 4E), in order to accommodate the ancillary gate structures 536-2 without shorting the ancillary gate structures 536-2 to the source contacts 540, 541, gaps between source contacts 540, 541 may be present where each ancillary gate structure 536-2 traverses between the primary gate structure 536-1 and the distal end of the ancillary gate structure 536-2. In such an embodiment, the source contacts 540, 541 that are physically separated by a gap may be electrically connected together using a conductive bridge (e.g., bridge 463, FIG. 4E) formed from portions of one or more of the patterned conductive layers and conductive vias of the build-up structure.

The ancillary drain contacts 538-2 also are electrically coupled to the drain bus 546, which in turn is connected to the output bond pad 548. Although not depicted in FIG. 5, the ancillary drain contacts 538-2 may be electrically coupled to the drain bus 546 using drain metallization composed of various conductive connections formed from portions of one or more of the patterned conductive layers and conductive vias of the build-up structure. In various alternate embodiments, the ancillary drain contacts 538-2 may be electrically coupled to the primary drain contact 538-1, and/or to the drain bus 546 or output bond pad 548 using wirebonds (not shown) or other conductive connections.

A channel (e.g., channel 470, FIG. 4C) underlies each set of adjacent primary drain contacts, primary gate structures, and source contacts 538-1, 536-1, 540 within each primary transistor element 543, thus providing for current to flow through the upper portion of the base substrate 580 between primary drain and source contacts 538-1, 540 in response to electrical signals applied to the input bond pad 544 and the primary gate structures 536-1. More particularly, during operation of a transistor die that includes one or more instances of FET segment 500, current flow through the primary transistor fingers is in a first direction (i.e., a horizontal direction in FIG. 5). Even more particularly, source current flows from the ground reference node (e.g., a conductive layer on the bottom of the substrate 502) through the source via 550, through source metallization (not shown) in the build-up structure to the source contacts 540, 541, through the channels in response to input signals received at the input bond pad 544/gate structures 536-1, and through the primary drain contacts 538-1 and any drain metallization to the output bond pad 548.

Similarly, a channel (e.g., channel 472, FIG. 4D) underlies each set of adjacent ancillary drain contacts, ancillary gate structures, and source contacts 538-2, 536-2, 541 within each ancillary transistor element 539, thus providing for current to flow through the upper portion of the base substrate between ancillary drain and source contacts 538-2, 541 in response to electrical signals applied to the ancillary gate structures 536-2. More particularly, during operation of a transistor die that includes one or more instances of FET segment 500, current flow through the ancillary transistor fingers is in a second direction (i.e., a vertical direction in FIG. 5). More particularly, source current flows from the ground reference node (e.g., a conductive layer on the bottom of the substrate 502) through the source via 550, through source metallization (not shown) in the build-up structure to the source contacts 541, through the channels in response to input signals received at the input bond pad 544/ancillary gate structures 536-2, and through the ancillary drain contacts 538-2 and any drain metallization to the output bond pad 548. As indicated by the above description, it is apparent that the direction of current flow through the primary transistor elements (e.g., primary transistor element 543) is orthogonal to (i.e., perpendicular to) the direction of current flow through the ancillary transistor elements (e.g., ancillary transistor element 539). Each transistor element may be electrically isolated from source TSVs with isolation regions at and below the top surface of the base substrate.

The lengths (vertical dimension in FIG. 5) of each of the primary gate structures 536-1 are substantially equal to each other. In addition, the ancillary gate structures 536-2 also have substantially equal lengths as each other, although the lengths of the ancillary gate structures 536-2 are significantly shorter than the lengths of the primary gate structures 536-1. As also apparent from FIG. 5, the ancillary gate structures 536-2 are arranged perpendicular to the primary gate structures 536-1.

Similarly, the lengths (vertical dimension in FIG. 5) of each of the primary drain contacts 538-1 are substantially equal to each other. The lengths (horizontal dimension in FIG. 5) of each of the ancillary drain contacts 538-2 also are substantially equal to each other, although the lengths of the ancillary drain contacts 538-2 are significantly shorter the lengths of the primary drain contacts 538-1.

According to an embodiment, during operation of a transistor die that includes one or more instances of FET segment 500, both the primary and ancillary transistor elements contribute to the total power provided by the transistor die. Essentially, the ancillary transistor elements add to the power provided by the primary transistor elements. Desirably, the ancillary transistor elements have lengths that are maximized within the ancillary regions 551, 552 in order to maximize the amount of power contributed by the ancillary transistor elements. Further, although FIG. 5 shows four ancillary transistor elements within each ancillary region 551, 552, in other embodiments, each ancillary region 551, 552 may include fewer or more ancillary transistor elements.

Figure 6:
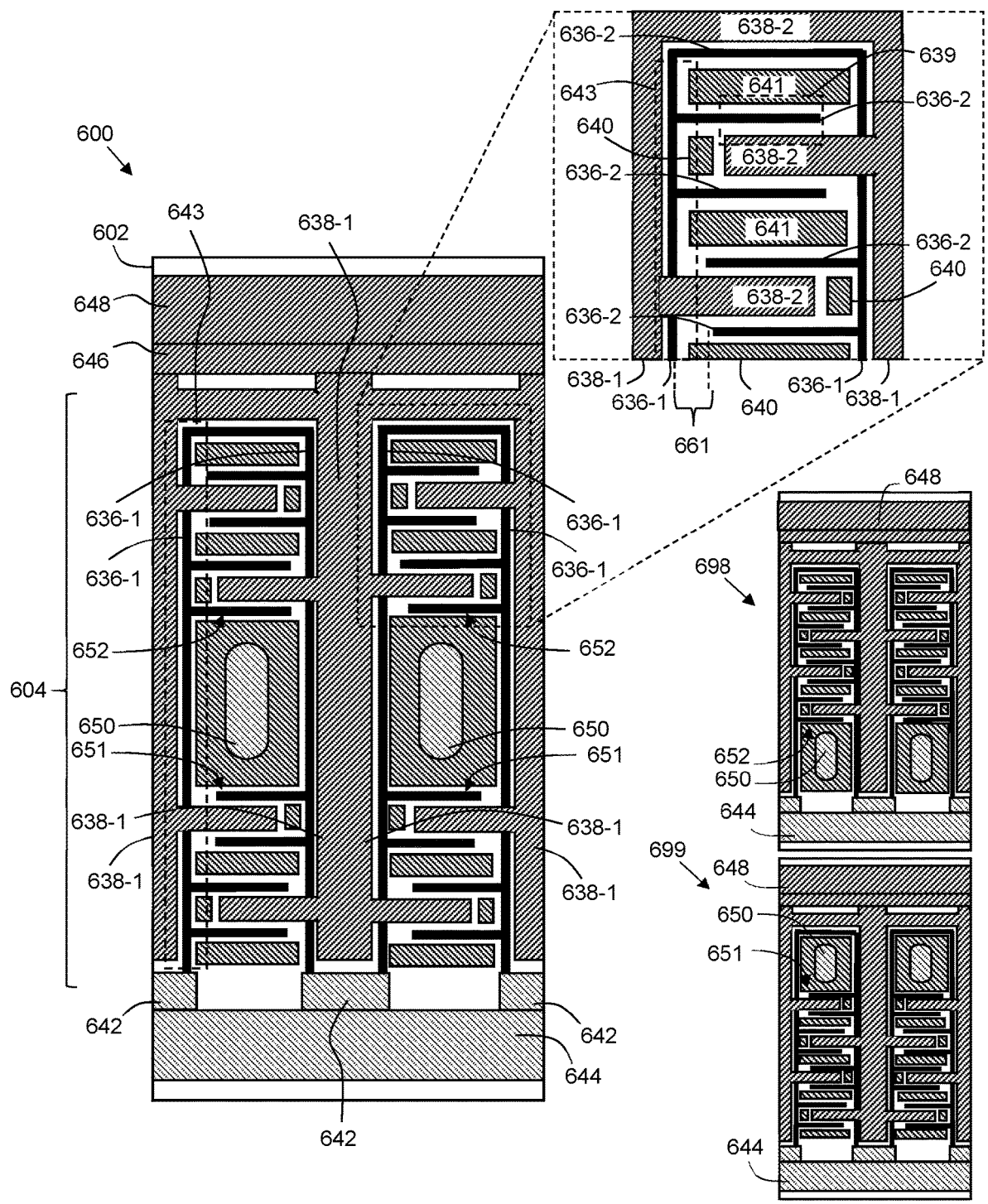
FIG. 6 shows a view of a layout of a FET segment with primary and ancillary transistor elements, in accordance with yet another embodiment.

FIG. 6 shows a top view of FET segment 600, in accordance with yet another alternate embodiment. It should be noted that, in the upper right corner of FIG. 6, an enlarged view of ancillary region 652 is depicted in order to better show the details of that region. Because FET segment 600 has many similarities to FET segment 400, cross-sectional views of FET segment 600 are not provided for succinctness.

Again, FET segment 600 may employ a multi-layer circuit configured integrally formed within a semiconductor substrate 602. The semiconductor substrate 602 includes a base semiconductor substrate (e.g., base substrate 480, FIG. 4B) and a build-up structure (e.g., similar to build-up structure 490, FIG. 4B, but with modifications to implement the embodiment of FIG. 6) coupled to the top surface of the base substrate. The base semiconductor substrate may be formed, for example, from bulk or composite semiconductor materials (e.g., Si, GaN, GaAs, SoI, GaN-on-insulator (e.g., GaN on Si, GaN on silicon carbide, GaN on sapphire, and so on), or other suitable materials).

FET segment 600 includes an input bond pad 644 (or input terminal) proximate a first side of the die in which FET segment 600 is included, an output bond pad 648 (or output terminal) proximate an opposite, second side of the die in which FET segment 600 is included, and a central region 604 between the input and output bond pads 644, 648. Again, the input and output bond pads 644, 648 may be implemented as types of conductive I/O structures other than bond pads.

One or more source TSVs 650 are positioned within the central region 604 between the input and output terminals 644, 648. The source TSVs 650 are electrically connected to each source contact 640 through source metallization. In the FET segment 600, each source TSVs 650 is electrically coupled to two groups of source contacts 640, 641: one group on the input side of the source TSV 650, and another group on the output side of the source TSV 650. The source TSVs 650 extend through the base substrate and serve to electrically connect the source contacts 640 to a ground reference node (e.g., a conductive layer) on a lower surface of base substrate.

Associated with each source TSV 650, a first "input side" ancillary region 651 is present on the input side (i.e., between the source TSV 650 and the input bond pad 644), and a second "output side" ancillary region 652 is present on the output side (i.e., between the source TSV 650 and the output bond pad 648). In another embodiment, and as shown in alternate FET segment 698 in FIG. 6, the source TSV 650 may be positioned closer to the input bond pad 644, and only a single, output side ancillary region 652 may be provided between the source TSV 650 and the output bond pad 648. In another alternate embodiment, and as shown in alternate FET segment 699 in FIG. 6, the source TSV 650 may be positioned closer to the output bond pad 648, and only a single, input side ancillary region 651 may be provided between the source TSV 650 and the input bond pad 644. In still other embodiments, multiple source TSVs 650 may be included along an axis between the input and output bond pads 644, 648, and an ancillary region may be provided between those multiple source TSVs 650.

The primary transistor fingers are composed of a plurality of elongated primary gate structures 636-1 (or gate fingers) (four shown), elongated primary drain contacts 638-1 (or drain fingers) (four shown, noting that the two central drain contacts 638-1 are electrically coupled through drain metallization formed from a portion of a conductive layer), and source contacts 640, 641 (or source fingers) (multiple shown in the enlarged, upper-right view) formed within the build-up structure.

The primary drain and source contacts 638-1, 640, 641 are arranged in a substantially parallel configuration, with a primary gate structure 636-1 positioned between and oriented in parallel with the set of adjacent primary drain and source contacts 638-1, 640, 641. The primary gate structures 636-1 are coupled together by one or more conductive primary gate busses 642, which in turn are connected to the input bond pad 644 at an input side of FET segment 600. Similarly, the primary drain contacts 638-1 are coupled together by a conductive drain bus 646, which in turn is connected the output bond pad 648 at an output side of FET segment 600. Each primary transistor finger/element is configured so that, during operation, current from a primary source contact 640, 641 to the primary drain contact 638-1 flows in a first direction (e.g., a horizontal direction in the orientation of FIG. 6).

The ancillary transistor fingers may be located within either or both of the ancillary regions 651, 652, whereas the primary transistor fingers are located outside of the ancillary regions 651, 652. Referring to the upper-right enlarged view of ancillary region 652, the ancillary transistor fingers are composed of a plurality of ancillary gate structures 636-2 (or gate fingers) (five shown in the enlarged view), ancillary drain contacts 638-2 (or drain fingers) (two shown in the enlarged view), and the source contacts 641 formed within the build-up structure.

The ancillary drain and source contacts 638-2, 641 are arranged in a substantially parallel configuration, with an ancillary gate structure 636-2 positioned between sets of adjacent ancillary drain and source contacts 638-2, 641. According to an embodiment, the ancillary gate structures 636-2 each are electrically coupled to a different point along the primary gate structures 636-1. Except for the ancillary gate structure 636-2 that is closest to the output bond pad 648, each ancillary gate structure 636-2 extends perpendicularly from a primary gate structure 636-1 on one side of an ancillary region 651, 652 through the center of the ancillary region 651, 652 and toward, but not to, a primary gate structure 636-1 on the opposite side of the ancillary region 651, 652. In contrast, the ancillary gate structure 636-2 that is closest to the output bond pad 648 extends all the way between and contacts both of the primary gate structures 636-1 on both sides of the ancillary region 652. Each ancillary transistor finger/element is configured so that, during operation, current from the ancillary source contact 641 to the ancillary drain contact 638-2 flows in a perpendicular direction from the current within the primary transistor finger/element (e.g., a vertical direction in the orientation of FIG. 6). In other words, the primary and ancillary transistor fingers/elements support current flow in perpendicular directions (i.e., different directions). Accordingly, in the embodiment of FIG. 6, the primary and ancillary transistor fingers/elements may be considered to be oriented perpendicular to each other.

A significant difference between the FET segment 600 and FET segment 500 is that, in FET segment 600, each set of two ancillary gate structures 636-2 that "share" an ancillary drain contact 638-2 are electrically coupled to a same primary gate structure 636-1, rather than being coupled to primary gate structures on opposite sides of the ancillary region 652. In the embodiment of FIG. 6, within any ancillary region 651, 652, a first set of two, adjacent ancillary gate structures 636-2 extend from their proximal ends, which are coupled to a first (e.g., left) primary gate structure 636-1, to their distal ends, which terminate before reaching a second (e.g., right) primary gate structure 636-1. Similarly, a second set of two, adjacent ancillary gate structures 636-2 extend from their proximal ends, which are coupled to the second (e.g., right) primary gate structure 636-1, to their distal ends, which terminate before reaching the first (e.g., left) primary gate structure 636-1. As can be seen in the enlarged view in FIG. 6, a gap 661 is present between the distal ends of the aforementioned ancillary gate structures 636-2 and the primary gate structures 636-1 to which the distal ends are not connected.

The input bond pad 644 is coupled to the ancillary gate structures 636-2 through the primary gate structures 636-1. The ancillary drain contacts 638-2 are electrically coupled to the drain bus 646 (e.g., through drain metallization and/or wirebonds), which in turn is connected to the output bond pad 648. A channel (e.g., channel 470, FIG. 4C) underlies each set of adjacent primary drain contacts, primary gate structures, and source contacts 638-1, 636-1, 640 within each primary transistor element 643, thus providing for current to flow through the upper portion of the base substrate 680 between primary drain and source contacts 638-1, 640 in response to electrical signals applied to the input bond pad 644 and the primary gate structures 636-1. Similarly, a channel (e.g., channel 472, FIG. 4D) underlies each set of adjacent ancillary drain contacts, ancillary gate structures, and source contacts 638-2, 636-2, 641 within each ancillary transistor element 639, thus providing for current to flow through the upper portion of the base substrate between ancillary drain and source contacts 638-2, 641 in response to electrical signals applied to the ancillary gate structures 636-2. According to an embodiment, during operation of a transistor die that includes one or more instances of FET segment 600, both the primary and ancillary transistor elements contribute to the total power provided by the transistor die.

Figure 7:
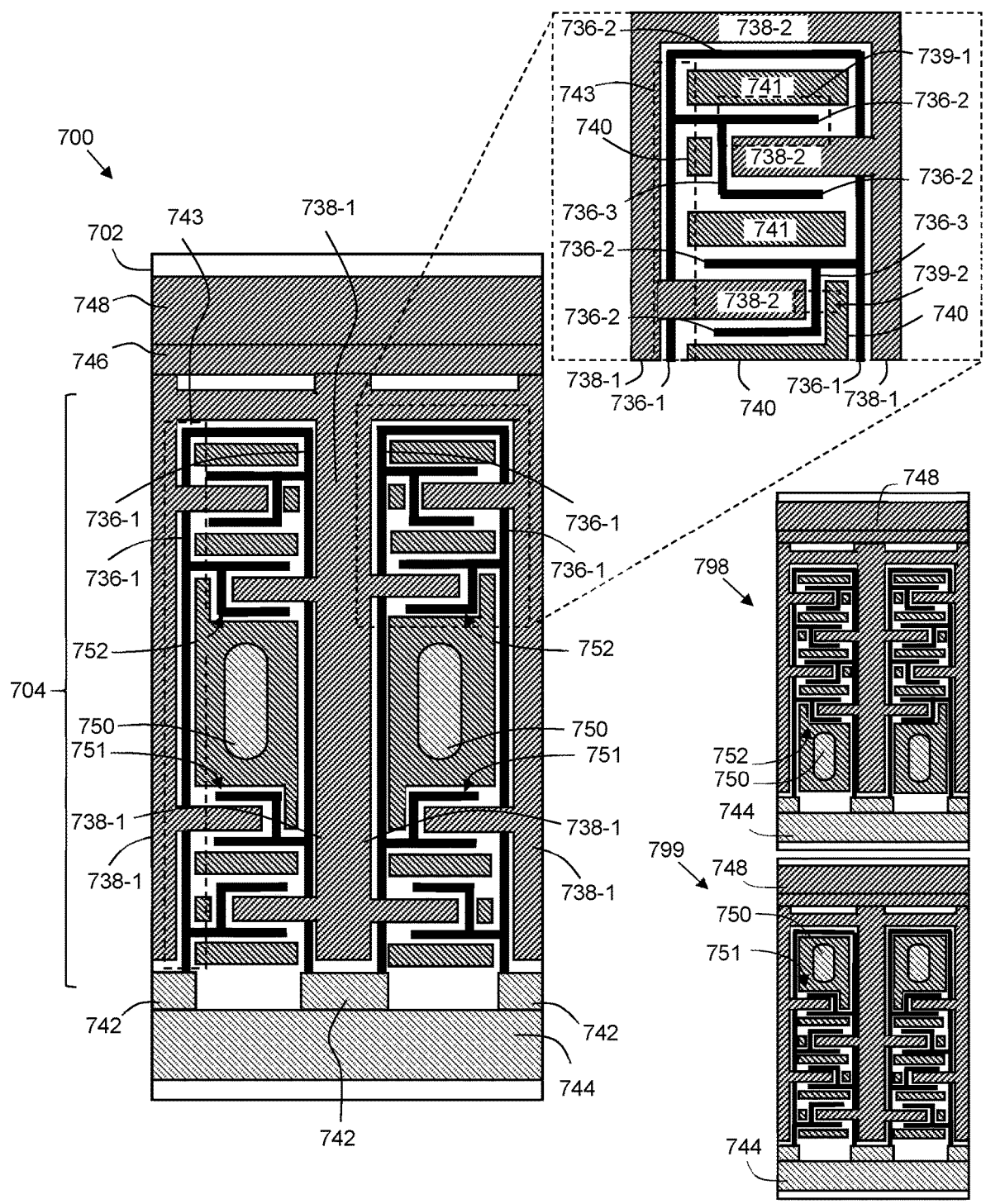
FIG. 7 shows a view of a layout of a FET segment with primary and ancillary transistor elements, in accordance with yet another embodiment.

FIG. 7 shows a top view of FET segment 700, in accordance with yet another alternate embodiment. It should be noted that, in the upper right corner of FIG. 7, an enlarged view of ancillary region 752 is depicted in order to better show the details of that region. Because FET segment 700 has many similarities to FET segment 400, cross-sectional views of FET segment 700 are not provided for succinctness.

Again, FET segment 700 may employ a multi-layer circuit configured integrally formed within a semiconductor substrate 702. The semiconductor substrate 702 includes a base semiconductor substrate (e.g., base substrate 480, FIG. 4B) and a build-up structure (e.g., similar to build-up structure 490, FIG. 4B, but with modifications to implement the embodiment of FIG. 7) coupled to the top surface of the base substrate. The base semiconductor substrate may be formed, for example, from bulk or composite semiconductor materials (e.g., Si, GaN, GaAs, SoI, GaN-on-insulator (e.g., GaN on Si, GaN on silicon carbide, GaN on sapphire, and so on), or other suitable materials).

FET segment 700 includes an input bond pad 744 (or input terminal) proximate a first side of the die in which FET segment 700 is included, an output bond pad 748 (or output terminal) proximate an opposite, second side of the die in which FET segment 700 is included, and a central region 704 between the input and output bond pads 744, 748. Again, the input and output bond pads 744, 748 may be implemented as types of conductive I/O structures other than bond pads.

One or more source TSVs 750 are positioned within the central region 704 between the input and output terminals 744, 748. The source TSVs 750 are electrically connected to each source contact 740 through source metallization. In the FET segment 700, each source TSVs 750 is electrically coupled to two groups of source contacts 740, 741: one group on the input side of the source TSV 750, and another group on the output side of the source TSV 750. The source TSVs 750 extend through the base substrate and serve to electrically connect the source contacts 740 to a ground reference node (e.g., a conductive layer) on a lower surface of base substrate.

Associated with each source TSV 750, a first "input side" ancillary region 751 is present on the input side (i.e., between the source TSV 750 and the input bond pad 744), and a second "output side" ancillary region 752 is present on the output side (i.e., between the source TSV 750 and the output bond pad 748). In another embodiment, and as shown in alternate FET segment 798 in FIG. 7, the source TSV 750 may be positioned closer to the input bond pad 744, and only a single, output side ancillary region 752 may be provided between the source TSV 750 and the output bond pad 748. In another alternate embodiment, and as shown in alternate FET segment 799 in FIG. 7, the source TSV 750 may be positioned closer to the output bond pad 748, and only a single, input side ancillary region 751 may be provided between the source TSV 750 and the input bond pad 744. In still other embodiments, multiple source TSVs 750 may be included along an axis between the input and output bond pads 744, 748, and an ancillary region may be provided between those multiple source TSVs 750.

The primary transistor fingers are composed of a plurality of elongated primary gate structures 736-1 (or gate fingers) (four shown), elongated primary drain contacts 738-1 (or drain fingers) (four shown, noting that the two central drain contacts 738-1 are electrically coupled through drain metallization formed from a portion of a conductive layer), and source contacts 740, 741 (or source fingers) (multiple shown in the enlarged, upper-right view) formed within the build-up structure.

The primary drain and source contacts 738-1, 740, 741 are arranged in a substantially parallel configuration, with a primary gate structure 736-1 positioned between and oriented in parallel with the set of adjacent primary drain and source contacts 738-1, 740, 741. The primary gate structures 736-1 are coupled together by one or more conductive primary gate busses 742, which in turn are connected to the input bond pad 744 at an input side of FET segment 700. Similarly, the primary drain contacts 738-1 are coupled together by a conductive drain bus 746, which in turn is connected the output bond pad 748 at an output side of FET segment 700.

The ancillary transistor fingers may be located within either or both of the ancillary regions 751, 752, whereas the primary transistor fingers are located outside of the ancillary regions 751, 752. Referring to the upper-right enlarged view of ancillary region 752, two basic types of ancillary transistor fingers are present, in the embodiment of FIG. 7. A first type of ancillary transistor finger includes an ancillary gate structure 736-2 (or gate finger) (five shown in the enlarged view), which is oriented perpendicularly to the primary gate structures 736-1, along with an ancillary drain contact 738-2 (or drain finger) (two shown in the enlarged view), and a source contact 741. A second type of ancillary transistor finger includes an ancillary gate structure 736-3 (or gate finger) (two shown in the enlarged view), which is oriented in parallel with the primary gate structures 736-1 and perpendicular to the ancillary gate structures 736-2. The second type of ancillary transistor finger also includes an ancillary drain contact 738-2 and a source contact 740 (e.g., a source contact 740 that also forms a portion of a primary transistor finger). According to the illustrated embodiment, each of the ancillary gate structures 736-3 of the second type of ancillary transistor finger is connected between a set of two of the ancillary gate structures 736-2 of the first type of ancillary transistor finger.

The ancillary drain and source contacts 738-2, 741 are arranged in a substantially parallel configuration, with an ancillary gate structure 736-2 positioned between sets of adjacent ancillary drain and source contacts 738-2, 741. According to an embodiment, some of the ancillary gate structures 736-2 are directly connected to the primary gate structures 736-1, whereas other ones of the ancillary gate structures 736-2 are indirectly connected to the primary gate structures 736-1 through an ancillary gate structure 736-3 and a portion of another one of the ancillary gate structures 736-2. In other words, two parallel-oriented ancillary gate structures 736-2 and one perpendicular ancillary gate structure 736-3 are connected to form a "fork-like" gate structure.

The input bond pad 744 is coupled to the ancillary gate structures 736-2, 736-3 through the primary gate structures 736-1. The ancillary drain contacts 738-2 are electrically coupled to the drain bus 746, which in turn is connected to the output bond pad 748. A channel (e.g., channel 470, FIG. 4C) underlies each set of adjacent primary drain contacts, primary gate structures, and source contacts 738-1, 736-1, 740 within each primary transistor element 743, thus providing for current to flow through the upper portion of the base substrate 780 between primary drain and source contacts 738-1, 740 in response to electrical signals applied to the input bond pad 744 and the primary gate structures 736-1. Similarly, a channel (e.g., channel 472, FIG. 4D) underlies each set of adjacent ancillary drain contacts, ancillary gate structures, and source contacts 738-2, 736-2, 741 within each first type of ancillary transistor element 739-1, thus providing for current to flow through the upper portion of the base substrate between ancillary drain and source contacts 738-2, 741 in response to electrical signals applied to the ancillary gate structures 736-2. Finally, a channel (e.g., channel 472, FIG. 4D) underlies each set of adjacent ancillary drain contacts, ancillary gate structures, and source contacts 738-2, 736-3, 740 within each second type of ancillary transistor element 739-2, thus providing for current to flow through the upper portion of the base substrate between ancillary drain and source contacts 738-2, 740 in response to electrical signals applied to the ancillary gate structures 736-3. According to an embodiment, during operation of a transistor die that includes one or more instances of FET segment 700, both the primary and ancillary transistor elements contribute to the total power provided by the transistor die.

Figure 8A:
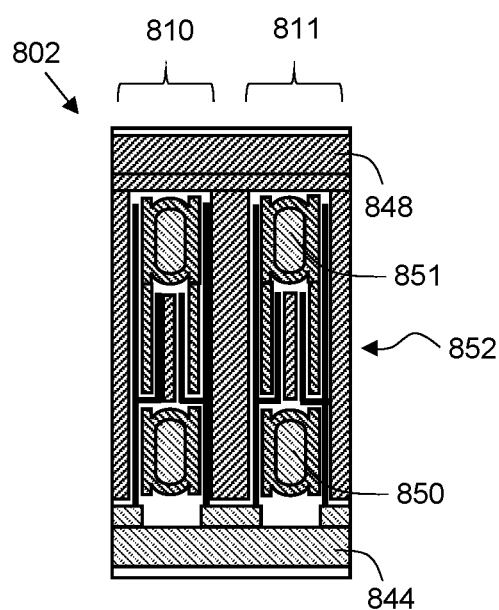
FIGS. 8A, 8B, and 8C (referred to collectively herein as FIG. 8) show top views of layouts of FET segments with primary and ancillary transistor elements, in accordance with several additional embodiments.
Figure 8B:
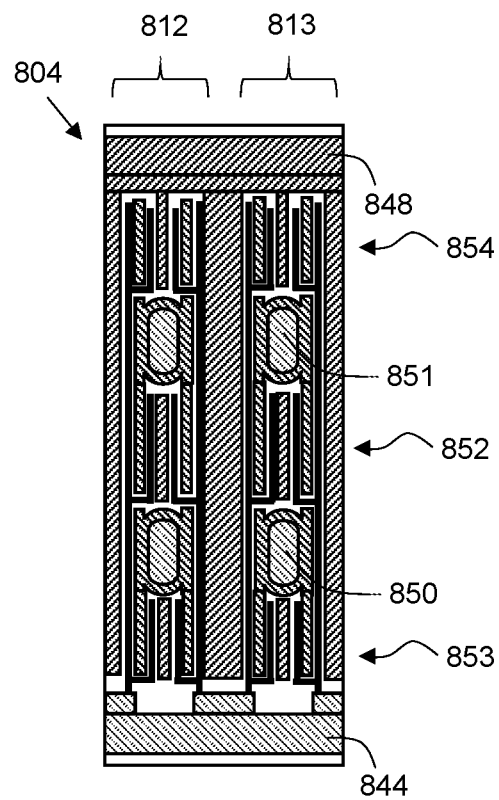

In the top views associated with FIGS. 3-7, each FET segment is shown to include two side-by-side transistor "units," where each transistor unit includes only one source TSV positioned between the input and output terminals. In various alternate embodiments, and as illustrated in FIGS. 8A and 8B, a FET segment 802, 804 alternatively may have multiple (e.g., two or more) source TSVs 850, 851 positioned within the central region between the input and output terminals 844, 848 for any given transistor unit 810, 811, 812, 813. For example, in each of FET segments 802, 804, illustrated in FIGS. 8A and 8B, respectively, for each transistor unit 810-813, a first source TSV 850 is located proximate to the input terminal 844, and a second source TSV 851 is located proximate to the output terminal 848.

Each of FET segments 802, 804 also includes multiple primary transistor fingers, with each primary transistor finger including a plurality of elongated primary gate structures/fingers, a plurality of elongated primary drain contacts/fingers, and a plurality of source contacts/fingers formed within the build-up structure. These primary transistor fingers are substantially the same as those previously described with respect to FET segments 300, 400, 500, 600, 700 (FIGS. 3-7).

In contrast to the previously described embodiments, each of FET segments 802, 804 also includes a central ancillary region 852, which is located between source TSVs 850, 851. One or more ancillary transistor fingers are located within each of the central ancillary regions 852. As with previously described embodiments, the ancillary transistor fingers are composed of a plurality of ancillary gate structures/fingers, ancillary drain contacts/fingers, and the source contacts, each formed within the build-up structure.

In the embodiment of FIG. 8B, each transistor unit 812, 813 of FET segment 804 also includes additional ancillary regions 853, 854. A first additional ancillary region 853 is positioned between source TSV 850 and the input terminal 844, and a second additional ancillary region 854 is positioned between source TSV 851 and the output terminal 848.

In FIGS. 8A and 8B, the ancillary transistor fingers within the central ancillary region 852 and the additional ancillary regions 853, 854 are substantially similar to the ancillary transistor fingers within ancillary regions 351, 352 of FIG. 3A, and the details regarding those ancillary transistor fingers described in conjunction with FIG. 3 apply equally to the embodiments of FIGS. 8A and 8B. Accordingly, during operation, the directions of current flow are parallel for the primary transistor fingers and the ancillary transistor fingers in FIGS. 8A and 8B. In other embodiments, some or all of the ancillary transistor fingers with in the central ancillary region 852 and/or the additional ancillary regions 853, 854 may instead have substantially similar configurations to the ancillary transistor fingers within the ancillary regions 451, 452, 551, 552, 651, 652, 751, 752 of FIGS. 4-7.

Figure 8C:
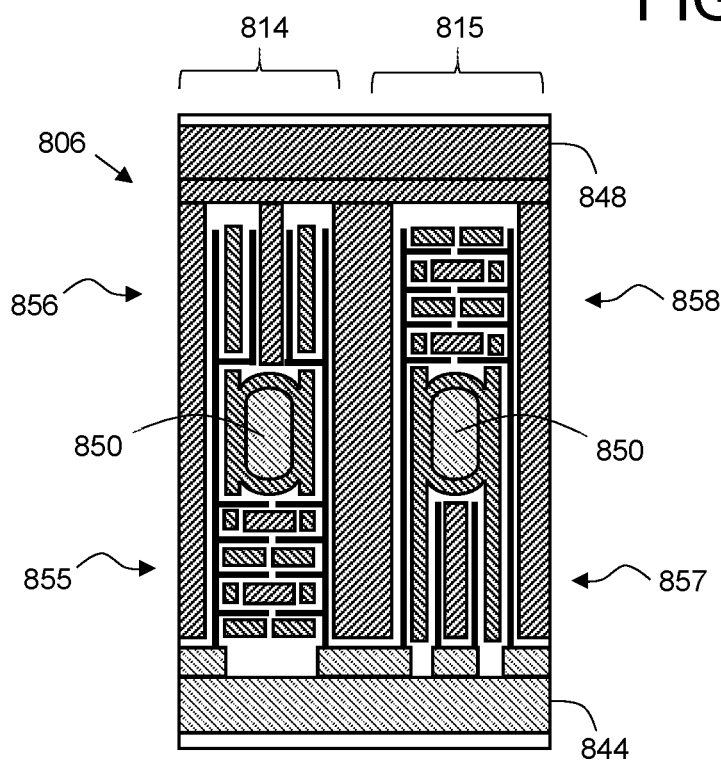

In yet other alternate embodiments, such as those shown in FIG. 8C, different types of ancillary transistor fingers may be implemented in different ancillary regions 855, 856, 857, 858. As with the previously described embodiments, each transistor unit 814, 815 of FET segment 806 includes multiple primary transistor fingers, with each primary transistor finger including a plurality of elongated primary gate structures/fingers, a plurality of elongated primary drain contacts/fingers, and a plurality of source contacts/fingers formed within the build-up structure. These primary transistor fingers are substantially the same as those previously described with respect to FET segments 300, 400, 500, 600, 700 (FIGS. 3-7).

In addition, each transistor unit 814, 815 of FET segment 806 includes ancillary regions 855/856, 857/858 on both the input and output sides of the source TSVs 850. The primary difference between FET segment 806 and previously described FET segments is that, in FET segment 806, different types of ancillary transistor fingers are implemented in the various ancillary regions 855-858. More particularly, in transistor unit 814, the ancillary transistor fingers within ancillary region 855 are substantially similar to the ancillary transistor fingers within ancillary region 451 of FIG. 4A, whereas the ancillary transistor fingers within ancillary region 856 are substantially similar to the ancillary transistor fingers within ancillary region 352 of FIG. 3A. Conversely, in transistor unit 815, the ancillary transistor fingers within ancillary region 857 are substantially similar to the ancillary transistor fingers within ancillary region 351 of FIG. 3A, whereas the ancillary transistor fingers within ancillary region 858 are substantially similar to the ancillary transistor fingers within ancillary region 452 of FIG. 4A.

Accordingly, during operation, the directions of current flow are parallel for the primary transistor fingers and the ancillary transistor fingers in ancillary regions 856 and 857, whereas the directions of current flow are perpendicular for the primary transistor fingers and the ancillary transistor fingers in ancillary regions 855 and 858. FIG. 8C is intended to indicate that any combination of different ancillary transistor fingers may be implemented in different ancillary regions, and in fact different types of ancillary transistor fingers may be implemented in a single ancillary region. Essentially, any combination of the various ancillary transistor finger configurations illustrated in FIGS. 3-7 may be used in the ancillary regions of a particular transistor unit, in various embodiments. This includes transistor units with a single source TSV and transistor units with multiple source TSVs (e.g., transistor units 810-813). In still other embodiments, different configurations of the various ancillary transistor fingers illustrated in FIGS. 3-7 may be used in different transistor units within a single FET device.

Figure 9:
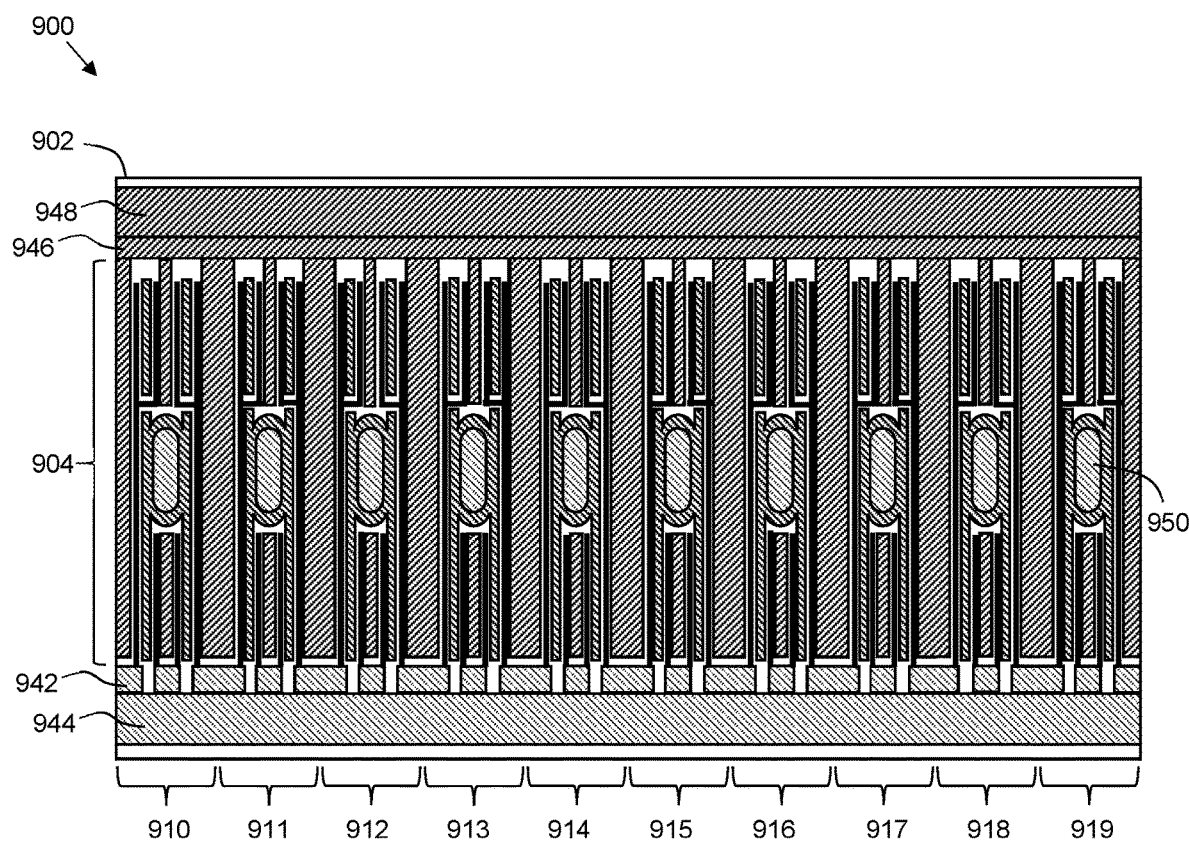
FIG. 9 shows a top view of a FET that includes multiple instances of the FET segment of FIG. 3.

In order to build a power transistor of a desired power capability, multiple instances of the transistor units within FET segments 300, 398, 399, 400, 498, 499, 500, 598, 599, 600, 698, 699, 700, 798, 799, 802, 804, 806 may be replicated in parallel and interconnected with common input and output bond pads. For example, FIG. 9 shows a top view of a FET 900 that includes a number, N, of instances of the transistor units of FET segment 300 of FIG. 3. More particularly, FET 900 includes ten FET segment transistor units 910, 911, 912, 913, 914, 915, 916, 917, 918, 919 (i.e., N=10) integrally formed within a single semiconductor substrate 902. Those of skill in the art would understand, based on the description herein, that the number, N, of FET segment transistor units included within a device may be greater or less than 10 (e.g., 1≤N≤40 or more, in various embodiments), depending on the desired periphery and power capability of the FET 900. Further, those of skill in the art would understand, based on the description herein, that the transistor units 910-919 each may have any of the transistor unit configurations illustrated and described in conjunction with FIGS. 3-8. The transistor units 910-919 may be identical, as illustrated in FIG. 9, or the transistor units 910-919 may have a variety of different configurations (e.g., any combination of configurations illustrated and described in conjunction with FIGS. 3-8).

As previously discussed, semiconductor substrate 902 may include a base semiconductor substrate (e.g., base semiconductor substrate 380, 480, FIGS. 3, 4) and a build-up structure (e.g., build-up structure 390, 490, FIGS. 3, 4) coupled to the top surface of the base semiconductor substrate. The base semiconductor substrate may be formed, for example, from bulk or composite semiconductor materials (e.g., Si, GaN, GaAs, Sol, GaN-on-insulator, or other suitable materials). The build-up structure includes multiple dielectric layers that separate multiple patterned conductive layers, along with conductive vias that electrically connect portions of the conductive layers. The various details and embodiments associated with substrate 302, 402, 502 (FIGS. 3-5), discussed above, apply also to the substrate 902 of FIG. 9, and accordingly those details and embodiments are intended to apply also to FET 900.

Each of the FET segment transistor units 910-919 includes a central region (e.g., central region 304, 404, 504, 604, 704, FIGS. 4-7) formed in the substrate 902. A combination of the central regions for all FET segments 910-919 is referred to as a cumulative central region 904. Cumulative central region 904 includes all of the sets of interdigitated gate structures (e.g., gate structures 336-1, 336-2, 336-3, 436-1, 436-2, 536-1, 536-2, 636-1, 636-2, 736-1, 736-2, 736-3, FIGS. 3-7), drain contacts (e.g., drain contact 338-1, 338-2, 338-3, 438-1, 438-2, 538-1, 538-2, 638-1, 638-2, 738-1, 738-2, FIGS. 3-7), and source contacts (e.g., source contacts 340, 440, 441, 540, 541, 640, 641, 740, 741, FIGS. 3-7) for all of the FET segment transistor units 910-919.

The drain contacts (e.g., drain contacts 338-1, 338-2, 338-3, 438-1, 438-2, 538-1, 538-2, 638-1, 638-2, 738-1, 738-2, FIGS. 3-7) for all of the FET segment transistor units 910-919 are coupled together by drain metallization and a drain bus 946. An output bond pad 948 is coupled to the drain bus 946 at an output side of central region 904. As shown in FIG. 9, the drain bus 946 and the output bond pad 948 are elongated conductive structures that extend across the combined width of all of the FET segment transistor units 910-919. When FET 900 is incorporated into a larger electrical system (e.g., an amplifier), a plurality of wirebonds would have first ends coupled along the length of the output bond pad 948, and second ends coupled to a bond pad on a substrate that supports other portions of the electrical system. In other embodiments, the output bond pad 948 may be configured as a terminal that is suitable for solder attachment to a corresponding conductive pad on a system substrate (e.g., the transistor 900 may be flip-chip bonded to the system substrate).

Additionally, the source contacts (e.g., source contacts 340, 440, 441, 540, 541, 640, 641, 740, 741, FIGS. 3-7) for each of the FET segment transistor units 910-919 are coupled to one another via source metallization associated with each FET segment transistor unit 910-919, and the source metallization, in turn, is coupled to source TSVs 950.

According to an embodiment, the gate structures (e.g., gate structures 336-1, 336-2, 336-3, 436-1, 436-2, 536-1, 536-2, 636-1, 636-2, 736-1, 736-2, 736-3, FIGS. 3-7) for each FET segment transistor unit 910-919 are coupled together by one or more gate busses 942. An input bond pad 944, is coupled to all of the gate busses 942 at an input side of central region 904. As shown in FIG. 9, the input bond pad 944 is an elongated conductive structure that extends across the combined width of all of the FET segment transistor units 910-919. More specifically, the input bond pad 944 is formed in the semiconductor substrate 902 and spaced apart from the central area 904, and the input bond pad 944 is physically and electrically continuous between the ends of the input bond pad 944 (i.e., the input bond pad 944 is unsegmented). In other embodiments, the input bond pad 944 may be segmented across its width. When FET 900 is incorporated into a larger electrical system (e.g., an amplifier), a plurality of wirebonds would have first ends coupled along the length of the input bond pad 944, and second ends coupled to a bond pad on a substrate that supports other portions of the electrical system. In other embodiments, as indicated above, the input bond pad 944 may be configured as a terminal that is suitable for solder attachment to a corresponding conductive pad on a system substrate (e.g., the transistor 900 may be flip-chip bonded to the system substrate).

An embodiment of a transistor die includes a semiconductor substrate with a base substrate and a build-up structure integrally formed on a top surface of the base substrate, an input terminal within the build-up structure, an output terminal within the build-up structure, and a source TSV positioned between the input and output terminals. The source TSV extends between the top surface of the base substrate and a bottom surface of the base substrate, and is electrically coupled through source metallization to at least one source contact. The transistor die also includes first and second primary drain contacts within the build-up structure. The first and second primary drain contacts are electrically coupled to the output terminal, the first primary drain contact extends from the output terminal toward the input terminal past a first side of the source TSV, and the second primary drain contact extends from the output terminal toward the input terminal past a second side of the source TSV. A first ancillary region of the semiconductor substrate is located adjacent to the source TSV, and boundaries of the first ancillary region are defined by the source TSV, the first and second drain contacts, and one of the input terminal or the output terminal. The transistor die also includes a first ancillary transistor element located within the first ancillary region. The first ancillary transistor element has a first ancillary drain contact and a first ancillary gate structure. The first ancillary drain contact is electrically coupled to the output terminal, and the first ancillary gate structure is electrically coupled to the input terminal.

Another embodiment of a transistor die includes input and output terminals integrally formed with a semiconductor substrate, and a source through-substrate via (TSV) positioned between the input and output terminals. The transistor die further includes a first primary drain contact extending from the output terminal toward the input terminal past a first side of the source TSV, and a second primary drain contact extending from the output terminal toward the input terminal past a second side of the source TSV. An ancillary region is located adjacent to the source TSV, and boundaries of the ancillary region are defined by the source TSV, the first and second drain contacts, and one of the input terminal or the output terminal. The transistor further includes a primary transistor element, including a primary drain contact, a primary source contact, and a primary gate structure, located outside of the first ancillary region, and an ancillary transistor element, including an ancillary drain contact, an ancillary source contact, and an ancillary gate structure, located within the ancillary region.

Yet another embodiment of a transistor die includes input and output terminals integrally formed with a semiconductor substrate, first and second source TSVs positioned between the input and output terminals, and first and second primary drain contacts that are electrically coupled to the output terminal. The first primary drain contact extends from the output terminal toward the input terminal past first sides of the first and second source TSVs, and the second primary drain contact extends from the output terminal toward the input terminal past second sides of the first and second source TSVs. A first ancillary region of the semiconductor substrate is located between the first and second source TSVs, and boundaries of the first ancillary region are defined by the first source TSV, the second source TSV, and the first and second drain contacts. The transistor die further includes a primary transistor element and a first ancillary transistor element. The primary transistor element includes a primary drain contact, a primary source contact, and a primary gate structure, located outside of the first ancillary region. The first ancillary transistor element includes an ancillary drain contact, an ancillary source contact, and an ancillary gate structure, located within the first ancillary region.

It should be understood that the use of relational terms, if any, such as first, second and third, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A transistor die comprising:
   a semiconductor substrate with a base substrate and a build-up structure integrally formed on a top surface of the base substrate;
   an input terminal within the build-up structure;
   an output terminal within the build-up structure;
   a source through-substrate via (TSV) positioned between the input and output terminals, wherein the source TSV extends between the top surface of the base substrate and a bottom surface of the base substrate, and is electrically coupled through source metallization to at least one source contact;
   first and second primary drain contacts within the build-up structure, wherein the first and second primary drain contacts are electrically coupled to the output terminal, the first primary drain contact extends from the output terminal toward the input terminal past a first side of the source TSV, and the second primary drain contact extends from the output terminal toward the input terminal past a second side of the source TSV;
   a first ancillary region of the semiconductor substrate located adjacent to the source TSV, wherein boundaries of the first ancillary region are defined by the source TSV, the first and second drain contacts, and one of the input terminal or the output terminal; and
   a first ancillary transistor element located within the first ancillary region and having a first ancillary drain contact and a first ancillary gate structure, wherein the first ancillary drain contact is electrically coupled to the output terminal, and the first ancillary gate structure is electrically coupled to the input terminal.

2. The transistor die of claim 1, further comprising:
   first and second source contacts within the build-up structure and electrically coupled through the source metallization to the source TSV;
   first and second primary gate structures within the build-up structure and electrically coupled to the input terminal, wherein the first primary gate structure extends from the input terminal toward the output terminal along a first side of the ancillary region and between the first source contact and the first drain contact, and the second primary gate structure extends from the input terminal toward the output terminal along a second side of the ancillary region and between the second source contact and the second drain contact;
   a first primary transistor element comprising the first drain contact, the first primary gate structure, and the first source contact; and
   a second primary transistor element comprising the second drain contact, the second primary gate structure, and the second source contact.

3. The transistor die of claim 1, wherein the first ancillary region is located between the source TSV and the input terminal.

4. The transistor die of claim 3, further comprising:
   a first source contact within the build-up structure and electrically coupled through the source metallization to the source TSV, wherein the first source contact extends through an area between the first primary drain contact and the ancillary region,
   wherein the first ancillary drain contact is located in the first ancillary region between the third side of the source TSV and the input terminal, and
   wherein the first ancillary gate structure extends between the first ancillary drain contact and the first source contact.

5. The transistor die of claim 4, further comprising:
   a second source contact within the build-up structure and electrically coupled through the source metallization to the source TSV, wherein the second source contact extends through an area between the second primary drain contact and the ancillary region; and
   a second ancillary transistor element located within the first ancillary region and including the first ancillary drain contact and a second ancillary gate structure, wherein the second ancillary gate structure is electrically coupled to the input terminal, and the second ancillary gate structure extends between the first ancillary drain contact and the second source contact.

6. The transistor die of claim 1, wherein the first ancillary region is located between the source TSV and the output terminal.

7. The transistor die of claim 6, further comprising:
   a first source contact within the build-up structure and electrically coupled through the source metallization to the source TSV, wherein the first source contact extends through an area between the first primary drain contact and the ancillary region; and
   a first primary gate structure within the build-up structure and electrically coupled to the input terminal, wherein the first primary gate structure extends from the input terminal toward the output terminal along a first side of the ancillary region and through an area between the first source contact and the first primary drain contact;
   wherein the first ancillary drain contact is located in the first ancillary region between the source TSV and the output terminal, and
   wherein the first ancillary gate structure extends between the first ancillary drain contact and the first source contact, and the first ancillary gate structure is electrically coupled to the first primary gate structure.

8. The transistor die of claim 7, further comprising:
   a second source contact within the build-up structure and electrically coupled through the source metallization to the source TSV, wherein the second source contact extends through an area between the second primary drain contact and the ancillary region;
   a second primary gate structure within the build-up structure and electrically coupled to the input terminal, wherein the second primary gate structure extends from the input terminal toward the output terminal along a second side of the ancillary region and between the second source contact and the second drain contact; and
   a second ancillary transistor element located within the first ancillary region and including the first ancillary drain contact and a second ancillary gate structure, wherein the second ancillary gate structure extends through an area between the first ancillary drain contact and the second source contact, and the second ancillary gate structure is electrically coupled to the second primary gate structure.

9. The transistor die of claim 6, further comprising:
a second ancillary region of the semiconductor substrate located adjacent to the source TSV, wherein boundaries of the second ancillary region are defined by the source TSV, the first and second drain contacts, and the input terminal; and
a second ancillary transistor element located within the second ancillary region.

10. The transistor die of claim 1, further comprising:
a first source contact within the build-up structure, wherein the first source contact is electrically coupled through the source metallization to the source TSV, and
wherein the first ancillary gate structure extends into an area between the first source contact and the first ancillary drain contact.

11. The transistor die of claim 10, wherein:
the first primary drain contact extends in a first direction from the output terminal toward the input terminal; and
the first ancillary gate structure extends in a second direction that is perpendicular to the first direction.

12. The transistor die of claim 11, further comprising:
a first primary gate structure within the build-up structure and electrically coupled between the input terminal and the first ancillary gate structure, wherein the first primary gate structure extends in the first direction.

13. The transistor die of claim 12, further comprising:
a second source contact within the build-up structure, wherein the second source contact is electrically coupled through the source metallization to the source TSV;
a second ancillary gate structure that extends in the second direction into an area between the second source contact and the first ancillary drain contact; and
a second primary gate structure within the build-up structure and electrically coupled between the input terminal and the second ancillary gate structure, wherein the second primary gate structure extends in the first direction.

14. The transistor die of claim 10, wherein:
the first source contact is located within the first ancillary region; and
the first ancillary drain contact is located between the first source contact and the source TSV.

15. The transistor die of claim 14, further comprising:
a second ancillary transistor element located within the first ancillary region and having a second ancillary drain contact and a second ancillary gate structure, wherein the second ancillary drain contact is electrically coupled to the output terminal through drain metallization, and the second ancillary gate structure is electrically coupled to the input terminal and extends into an area between the first source contact and the second ancillary drain contact.

16. The transistor die of claim 1, wherein the input terminal is an input bond pad, and the output terminal is an output bond pad.

17. The transistor die of claim 1, wherein the first ancillary drain contact is electrically coupled to the output terminal through drain metallization.

18. The transistor die of claim 1, wherein the first ancillary drain contact is electrically coupled to the output terminal through a wirebond.

19. A transistor die comprising:
a semiconductor substrate;
an input terminal integrally formed with the semiconductor substrate;
an output terminal integrally formed with the semiconductor substrate;
a source through-substrate via (TSV) positioned between the input and output terminals;
first and second primary drain contacts that are electrically coupled to the output terminal, wherein the first primary drain contact extends from the output terminal toward the input terminal past a first side of the source TSV, and the second primary drain contact extends from the output terminal toward the input terminal past a second side of the source TSV;
a first ancillary region of the semiconductor substrate located adjacent to the source TSV, wherein boundaries of the first ancillary region are defined by the source TSV, the first and second drain contacts, and one of the input terminal or the output terminal;
a primary transistor element, including a primary drain contact, a primary source contact, and a primary gate structure, located outside of the first ancillary region; and
an ancillary transistor element, including an ancillary drain contact, an ancillary source contact, and an ancillary gate structure, located within of the first ancillary region.

20. The transistor die of claim 19, wherein:
the primary transistor element is configured so that, during operation, current from the primary source contact to the primary drain contact flows in a first direction; and
the ancillary transistor element is configured so that, during operation, current from the ancillary source contact to the ancillary drain contact also flows in the first direction.

21. The transistor die of claim 19, wherein:
the primary transistor element is configured so that, during operation, current from the primary source contact to the primary drain contact flows in a first direction; and
the ancillary transistor element is configured so that, during operation, current from the ancillary source contact to the ancillary drain contact also flows in a second direction that is perpendicular to the first direction.

22. A transistor die comprising:
a semiconductor substrate;
an input terminal integrally formed with the semiconductor substrate;
an output terminal integrally formed with the semiconductor substrate;
a first source through-substrate via (TSV) positioned between the input and output terminals;
a second source TSV positioned between the input and output terminals;
first and second primary drain contacts that are electrically coupled to the output terminal, wherein the first primary drain contact extends from the output terminal toward the input terminal past first sides of the first and second source TSVs, and the second primary drain contact extends from the output terminal toward the input terminal past second sides of the first and second source TSVs;
a first ancillary region of the semiconductor substrate located between the first and second source TSVs, wherein boundaries of the first ancillary region are defined by the first source TSV, the second source TSV, and the first and second drain contacts;

a primary transistor element, including a primary drain contact, a primary source contact, and a primary gate structure, located outside of the first ancillary region; and a first ancillary transistor element, including an ancillary drain contact, an ancillary source contact, and an ancillary gate structure, located within the first ancillary region.

23. The transistor die of claim 22, further comprising:

a second ancillary region of the semiconductor substrate located adjacent to the first source TSV, wherein boundaries of the second ancillary region are defined by the first source TSV, the first and second drain contacts, and the input terminal.

24. The transistor die of claim 22, further comprising:

a second ancillary region of the semiconductor substrate located adjacent to the second source TSV, wherein boundaries of the second ancillary region are defined by the second source TSV, the first and second drain contacts, and the output terminal.

* * * * *